(12) United States Patent
Chiba

(10) Patent No.: US 10,418,969 B2
(45) Date of Patent: Sep. 17, 2019

(54) ELECTRONIC DEVICE, ELECTRONIC APPARATUS, AND VEHICLE

(71) Applicant: Seiko Epson Corporation, Tokyo (JP)

(72) Inventor: Seiichi Chiba, Minowa (JP)

(73) Assignee: Seiko Epson Corporation (JP)

( * ) Notice: Subject to any disclaimer, the term of this patent is extended or adjusted under 35 U.S.C. 154(b) by 427 days.

(21) Appl. No.: 15/302,325

(22) PCT Filed: Apr. 9, 2015

(86) PCT No.: PCT/JP2015/002017
§ 371 (c)(1),
(2) Date: Oct. 6, 2016

(87) PCT Pub. No.: WO2015/155995
PCT Pub. Date: Oct. 15, 2015

(65) Prior Publication Data
US 2017/0194935 A1 Jul. 6, 2017

(30) Foreign Application Priority Data

Apr. 11, 2014 (JP) .................. 2014-081711
Apr. 11, 2014 (JP) .................. 2014-081712

(51) Int. Cl.
*H01L 41/09* (2006.01)
*H03H 9/10* (2006.01)
(Continued)

(52) U.S. Cl.
CPC ............. *H03H 9/25* (2013.01); *H03B 28/00* (2013.01); *H03H 9/058* (2013.01);
(Continued)

(58) Field of Classification Search
CPC .. H03H 9/17; H03H 9/02; H03H 9/25; H03H 9/0547; H03H 9/058; H03H 9/1021;
(Continued)

(56) References Cited

U.S. PATENT DOCUMENTS

2012/0235762 A1 9/2012 Ii et al.
2014/0015380 A1 1/2014 Ii et al.
(Continued)

FOREIGN PATENT DOCUMENTS

| CN | 102684638 A | 9/2012 |
|---|---|---|
| JP | 08-330886 A | 12/1996 |
| JP | 11-112269 A | 4/1999 |
| JP | 2000-022483 A | 1/2000 |
| JP | 2000-332561 A | 11/2000 |
| JP | 2004-096275 A | 3/2004 |

(Continued)

*Primary Examiner* — Thomas M Dougherty
(74) *Attorney, Agent, or Firm* — Harness, Dickey & Pierce, P.L.C.

(57) ABSTRACT

An electronic device includes: a container including first and second projections disposed on a bottom plate; and a vibration element having an end on a third surface side of the vibration element placed in a container via a connector so that the first and second projections, and a first surface face each other with a void therebetween, and the first and second projection portions partially overlap the first surface on a fourth surface side of the vibration element, and are aligned along the direction intersecting the longitudinal direction of the vibration element. In addition, a relationship of L1>L2>L3 is satisfied when an interval between ends in the intersecting direction is L1, an interval between the first and second projections is L2, and an interval between ends in the intersecting direction of an electrode film is L3.

11 Claims, 15 Drawing Sheets

(51) Int. Cl.
　　　*H03H 9/17*　　　(2006.01)
　　　*H03H 9/25*　　　(2006.01)
　　　*H03H 9/05*　　　(2006.01)
　　　*H03B 28/00*　　(2006.01)
　　　*H03H 9/19*　　　(2006.01)

(52) U.S. Cl.
　　　CPC ........ *H03H 9/0547* (2013.01); *H03H 9/1021* (2013.01); *H03H 9/19* (2013.01); *H01L 2224/48091* (2013.01); *H01L 2224/73265* (2013.01)

(58) Field of Classification Search
　　　CPC . H03H 9/19; H03B 5/32; H03B 28/00; H01L 2224/48091; H01L 2224/73265
　　　USPC .................................. 310/348, 311–371, 800
　　　See application file for complete search history.

(56) References Cited

U.S. PATENT DOCUMENTS

2015/0214922 A1　　7/2015　Ii et al.
2016/0226465 A1*　 8/2016　Yamashita ............... H03H 9/19

FOREIGN PATENT DOCUMENTS

| JP | 2004-260512 A | | 9/2004 | |
|----|---------------|---|--------|---|
| JP | 2004-266595 A | | 9/2004 | |
| JP | 2004260512 A | * | 9/2004 | ............. H03B 5/32 |
| JP | 2008-131549 A | | 6/2008 | |
| JP | 2008-206002 A | | 9/2008 | |
| JP | 2013-239790 A | | 11/2013 | |
| JP | 2015-089037 A | | 5/2015 | |

\* cited by examiner

ELECTRONIC DEVICE, ELECTRONIC APPARATUS, AND VEHICLE

TECHNICAL FIELD

The present invention relates to an electronic device, an electronic apparatus provided with the electronic device, and a vehicle.

BACKGROUND ART

The electronic device which uses a piezoelectric material, such as quartz crystal, is used in many fields as an electronic component, such as an oscillator, a vibrator, a resonator, and a filter.

Among these, the oscillator is widely used in electronic apparatuses as a timing source including a time source or a control signal, a reference signal or the like. In the oscillator, a vibration element which has excitation electrodes provided on opposing main surfaces of a vibration region of the vibration element, and an electronic component which excites the vibration element and generates a stable reference frequency, are loaded in a container having an accommodation space, and the oscillator is air-tightly sealed. The vibration element is loaded in a cantilever structure of which only one end side is fixed in order to avoid the distortive influence caused by a difference in a linear expansion coefficient between the configuration materials of the container and the vibration element. Therefore, in a case where an impact caused by dropping is applied to the oscillator, there is a problem that there is a concern about damage generated as a free end portion of the vibration element is largely displaced and comes into contact with a part of the container.

In JP-A-2004-266595, a configuration in which a pillow portion disposed on a free end portion side of a quartz crystal vibration element which becomes a support in a case where an impact is applied to the quartz crystal vibration element, successively widens toward a fixing end portion side of the quartz crystal vibration element, in a container in which the quartz crystal vibration element which is a vibration element is disposed, is disclosed.

In addition, in JP-A-2013-239790, a configuration in which a pillow stand (pillow portion) which becomes a support in a case where an impact is applied to a piezoelectric vibration element is disposed in the direction intersecting the direction of linking a free end portion and a fixing end portion of the piezoelectric vibration element on the free end portion side of the piezoelectric vibration element, in a container in which a quartz crystal vibration element which is a vibration element is disposed, is disclosed.

In addition, in JP-A-11-112269, a configuration in which a pillow member (pillow portion) disposed in the direction intersecting the direction of linking a free end portion and a fixing end portion of a piezoelectric vibrator which becomes a support in a case where an impact is applied to the piezoelectric vibration element, becomes an inclined surface inclined upward toward the outward direction from the inside of the piezoelectric vibrator, in a container in which the piezoelectric vibrator which is a vibration element is disposed, is disclosed.

TECHNICAL PROBLEM

However, in the configurations in JP-A-2004-266595 and JP-A-2013-239790, it is possible to improve impact resistance of the vibration element by disposing an inner side of the pillow portion further on the inner side of the vibration element than the outer circumference of the vibration element. However, for example, there is a concern that the pillow portion and the excitation electrode come into contact with each other and the excitation electrode is damaged due to a positional relationship between the inner side of the pillow portion and the excitation electrode of the vibration element, and further, there is a concern about a change in a reference frequency of the oscillator or deterioration of temporal change characteristics.

In addition, in the configuration in JP-A-11-112269, since the pillow portion is disposed in an intermediate portion on a long side of the vibration element, for example, there is a concern that the free end portion of the vibration element and the container come into contact with each other due to a degree of the impact applied to the vibration element, and further, there is a concern about damage of the vibration element or deterioration of characteristics of the vibration element.

SUMMARY OF INVENTION

In order to solve at least a part of the above-described problems, the present invention can realize the following aspects and application examples.

APPLICATION EXAMPLE 1

An electronic device according to this application example includes: a container including a bottom plate, and a first projection portion and a second projection portion which are disposed on the bottom plate; and a vibration element which is accommodated in the container, in which the vibration element includes a first surface, a second surface, and a side surface which connects the first surface and the second surface to each other, in which the side surface includes a first side surface and a second side surface which are disposed to face each other, and a third side surface and a fourth side surface which are disposed to face each other and extend in the direction intersecting the first side surface and the second side surface, in which the first surface has an electrode film, in which the vibration element has the third side surface side placed on the first surface via the container and the connection member to make the first projection portion and the second projection portion, and the first surface face each other having a void therebetween, in which the first projection portion and the second projection portion are disposed to partially overlap the fourth side surface side of the first surface, and to be aligned along the direction in which the first side surface and the second side surface are aligned, in a plan view, and in which a relationship of L1 >L2 >L3 is satisfied when an interval between an end portion of the first side surface and an end portion of the second side surface of the vibration element is L1, an interval between an end portion on the second projection portion side of the first projection portion and an end portion on the first projection portion side of the second projection portion is L2, and an interval between an end portion on the first side surface side and an end portion on the second side surface side of the electrode film is L3, in a plan view.

According to this application example, by satisfying the relationship of L1 >L2, since the first projection portion and the second projection portion are disposed to partially overlap the vibration element on the free end portion side of the vibration element at two locations, it is possible to support the free end portion of the vibration element which is displaced as the impact is applied to the vibration element at two overlapped locations. Therefore, it is possible to further reduce damage of the vibration element generated as the free end portion of the vibration element is largely displaced due to the impact. In addition, by satisfying the relationship of L2 >L3, since the first projection portion and the second projection portion do not overlap the electrode film which configures the excitation electrode, it is possible to reduce a concern about damage of the excitation electrode due to contact of the first projection portion and the second projection portion with the excitation electrode. Therefore, it is possible to reduce a change in the reference frequency or deterioration of the temporal change characteristics. Accordingly, there is an effect that an electronic device having excellent impact resistance and stable oscillation characteristics can be obtained.

APPLICATION EXAMPLE 2

In the electronic device according to the above-described application example, the container includes a first side wall portion disposed in the direction along the first side surface, a second side wall portion disposed in the direction along the second side surface, and a third side wall portion disposed in the direction along the fourth side surface, in a plan view, the first projection portion is projected in the direction of the third side surface from a region in which the first side wall portion and the third side wall portion come into contact with each other, and the second projection portion is projected in the direction of the third side surface from a region in which the second side wall portion and the third side wall portion come into contact with each other.

According to this application example, since the first projection portion and the second projection portion are disposed toward the direction of the third side surface of the vibration element from the third side wall portion of the container, it is possible to elongate the part which overlaps the vibration element along the direction of linking the free end portion and the fixing end portion of the vibration element. Therefore, when the impact is applied to the vibration element, since it is possible to support the free end portion side of the vibration element which is largely displaced in a longer range, it is possible to further reduce a concern about damage of the vibration element generated as the free end portion of the vibration element is largely displaced due to the impact.

APPLICATION EXAMPLE 3

The electronic device according to the above-described application example, further includes: another projection portion disposed on the bottom plate, in which another projection portion partially overlaps the fourth side surface, and does not overlap the electrode film, in a plan view.

According to this application example, since the third projection portion which is another projection portion is disposed toward the direction of the third side surface from the third side wall portion in addition to the first projection portion and the second projection portion, it is possible to support the free end portion of the vibration element at three locations, and to further reduce a concern about damage of the vibration element generated as the free end portion of the vibration element is largely displaced due to the impact.

APPLICATION EXAMPLE 4

In the electronic device according to the above-described application example 1 or 2, the vibration element includes a first region having a first thickness along the vertical direction of the first surface, and a second region which is integrally provided in an outer circumference of the first region and has a second thickness which is thinner than that in the first region along the vertical direction, and a relationship of L2 >L4 and W1 >W2 is satisfied when an interval between the end portion on the first side surface side and the end portion on the second side surface side of the first region is L4, an interval between the end portion of the fourth side surface and the end portion on the fourth side surface side of the first region is W1, and a longer interval among the interval between the end portion of the fourth side surface and the end portion on the third side surface side of the first projection portion, and the interval between the end portion of the fourth side surface and the end portion on the third side surface side of the second projection portion is W2.

APPLICATION EXAMPLE 5

In the electronic device according to the above-described application example 3, the vibration element includes a first region having a first thickness along the vertical direction of the first surface, and a second region which is integrally provided in an outer circumference of the first region and has a second thickness which is thinner than that in the first region along the vertical direction, and a relationship of L2 >L4 and W1 >W2 is satisfied when an interval between the end portion on the first side surface side and the end portion on the second side surface side of the first region is L4, an interval between the end portion of the fourth side surface and the end portion on the fourth side surface side of the first region is W1, and a longer interval among the interval between the end portion of the fourth side surface and the end portion on the third side surface side of the first projection portion, and the interval between the end portion of the fourth side surface and the end portion on the third side surface side of the second projection portion is W2.

According to these application examples 4 and 5, even in a case of a vibration element of a mesa type structure having the first region in which a center portion of the vibration element is thick, by satisfying the relationship of L2 >L4 and W1 >W2, the first projection portion and the second projection portion come into contact with the first region of the vibration element. Accordingly, it is possible to reduce a concern about damage of the first region of the vibration element.

APPLICATION EXAMPLE 6

In the electronic device according to the above-described application example 1 or 2, an electronic component is disposed in the container.

APPLICATION EXAMPLE 7

In the electronic device according to the above-described application example 3, an electronic component is disposed in the container.

APPLICATION EXAMPLE 8

In the electronic device according to the above-described application example 4, an electronic component is disposed in the container.

According to these application examples 6 to 8, by loading the electronic component together with the vibration element, an electronic device having excellent impact resistance and stable vibration characteristics can be obtained.

APPLICATION EXAMPLE 9

An electronic device according to this application example includes: a container including a bottom plate, and a loading portion and a projection portion which are disposed on the bottom plate; and a vibration element which is accommodated in the container, in which the vibration element includes a first surface, a second surface, and a side surface which connects the first surface and the second surface to each other, in which the side surface includes a first side surface and a second side surface which are disposed to face each other, and a third side surface and a fourth side surface which are disposed to face each other and extend in the direction intersecting the first side surface and the second side surface, in which the vibration element has the third side surface side placed on the loading portion via a connection member to make the projection portion and the first surface face each other having a void therebetween, in which at least a part of the projection portion is disposed to overlap the first surface on the fourth side surface side, in a plan view, and in which a first virtual surface which extends on a surface on which the connection member of the loading portion is disposed, and a second virtual surface which extends on a surface which faces the vibration element of the projection portion, intersect each other by an angle which is greater than 90 degrees and smaller than 180 degrees.

According to this application example, since the projection portion is disposed to partially overlap the vibration element on the free end portion side of the vibration element, it is possible to support the free end portion of the vibration element which is displaced as the impact is applied to the vibration element at the overlapped locations. Therefore, it is possible to further reduce damage of the vibration element generated as the free end portion of the vibration element is largely displaced due to the impact. Accordingly, there is an effect that an electronic device having excellent impact resistance and stable oscillation characteristics can be obtained.

APPLICATION EXAMPLE 10

In the electronic device according to the above-described application example 9, the distance between the bottom plate and the surface of the projection portion which faces the vibration element along the normal line direction of the bottom plate is monotonously shortened toward the position at which the projection portion overlaps the inner side of the vibration element from the position at which the projection portion overlaps the outer edge of the vibration element, in a plan view.

According to this application example, an inclined surface in which the distance between the bottom plate and the surface of the projection portion which faces the vibration element along the normal line direction of the bottom plate is monotonously shortened toward the inner side from the outer edge of the vibration element in a plan view, is formed in the projection portion. Therefore, after the free end portion of the vibration element is displaced as the impact is applied to the vibration element and comes into contact with the projection portion, it is possible to reduce a concern that the vibration element is further bent, the projection portion and the excitation electrode come into contact with each other, and the excitation electrode is damaged, and to reduce a change in the reference frequency or deterioration of the temporal change characteristics.

APPLICATION EXAMPLE 11

In the electronic device according to the above-described application example 9 or 10, two projection portions are provided, and one projection portion is disposed to partially overlap the first surface on the first side surface side, and the other projection portion is disposed to partially overlap the first surface on the second side surface side, in a plan view, and a relationship of $L1 > L2 > L3$ is satisfied when an interval between an end portion of the first side surface and an end portion of a second side surface of the vibration element is $L1$, an interval between an end portion opposite to the other projection portion of the one projection portion and an end portion opposite to the one projection portion of the other projection portion is $L2$, and an interval between an end portion on the first side surface side and an end portion on the second side surface side of the electrode film is $L3$, in a plan view.

According to this application example, by satisfying the relationship of $L1 > L2$, since the first projection portion and the second projection portion can support the free end portion of the vibration element when the impact is applied to the vibration element, it is possible to reduce damage of the vibration element generated as the free end portion of the vibration element is largely displaced due to the impact. In addition, by satisfying the relationship of $L2 > L3$, when the impact is applied to the vibration element, it is possible to reduce a concern about damage of the excitation electrode due to contact of the first projection portion and the second projection portion with the electronic film which configures the excitation electrode. Therefore, it is possible to reduce a change in the reference frequency or deterioration of temporal change characteristics.

APPLICATION EXAMPLE 12

In the electronic device according to the above-described application example 11, the container includes a first side wall portion disposed in the direction along the first side surface, a second side wall portion disposed in the direction along the second side surface, and a third side wall portion disposed in the direction along the fourth side surface, in a plan view, the one projection portion is projected in the direction of the third side surface from a region in which the first side wall portion and the third side wall portion come into contact with each other, and the other projection portion is projected in the direction of the third side surface from a region in which the second side wall portion and the third side wall portion come into contact with each other.

According to this application example, since the first projection portion and the second projection portion are disposed toward the direction of the third side surface of the vibration element from the third side wall portion of the container, it is possible to elongate the part overlapping the vibration element along the direction of linking the free end portion and the fixing end portion of the vibration element. Therefore, it is possible to support the free end portion side of the vibration element which is largely displaced in a longer range when the impact is applied to the vibration element, and it is possible to further reduce damage of the vibration element generated as the free end portion of the vibration element is largely displaced due to the impact.

APPLICATION EXAMPLE 13

In the electronic device according to the above-described application example 11, the vibration element includes a first region having a first thickness along the normal line direction of the first surface at least on the first surface, and a second region having a second thickness which is thinner than that in the first region along the normal line direction of the first surface on the outer circumference of the first region, and a relationship of L2 >L4 and W1 >W2 is satisfied when an interval between the end portion on the first side surface side and the end portion on the second side surface side of the first region is L4, an interval between the end portion of the fourth side surface and the end portion on the fourth side surface side of the first region is W1, and a longer interval among the interval between the end portion of the fourth side surface and the end portion on the third side surface side of the one projection portion, and the interval between the end portion of the fourth side surface and the end portion on the third side surface side of the other projection portion is W2.

APPLICATION EXAMPLE 14

In the electronic device according to the above-described application example 12, the vibration element includes a first region having a first thickness along the normal line direction of the first surface at least on the first surface, and a second region having a second thickness which is thinner than that in the first region along the normal line direction of the first surface on the outer circumference of the first region, and a relationship of L2 >L4 and W1 >W2 is satisfied when an interval between the end portion on the first side surface side and the end portion on the second side surface side of the first region is L4, an interval between the end portion of the fourth side surface and the end portion on the fourth side surface side of the first region is W1, and a longer interval among the interval between the end portion of the fourth side surface and the end portion on the third side surface side of the one projection portion, and the interval between the end portion of the fourth side surface and the end portion on the third side surface side of the other projection portion is W2.

According to these application examples 13 and 14, even in a case of a vibration element of a mesa type structure having the first region in which the center portion of the vibration element is thick, by satisfying the relationship of L2 >L4 and W1 >W2, it is possible to reduce a concern about damage of the first region of the vibration element due to contact of the first projection portion and the second projection portion with the first region of the vibration element.

APPLICATION EXAMPLE 15

In the electronic device according to any one of the application examples 9 and 10, an electronic component is disposed in the container.

According to this application example, by loading the electronic component together with the vibration element, an electronic device having excellent impact resistance and stable vibration characteristics can be obtained.

APPLICATION EXAMPLE 16

An electronic apparatus according to this application example includes the electronic device according to any one of the above-described application examples 1 and 2.

APPLICATION EXAMPLE 17

An electronic apparatus according to this application example includes the electronic device according to any one of the above-described application examples 9 and 10.

According to these application examples 16 and 17, electronic apparatuses having excellent impact resistance and high reliability can be obtained by providing the electronic device of the present invention.

APPLICATION EXAMPLE 18

A vehicle according to this application example includes the electronic device according to any one of the above-described application examples 1 and 2.

APPLICATION EXAMPLE 18

A vehicle according to this application example includes the electronic device according to any one of the above-described application examples 9 and 10.

According to these application examples 18 and 19, a vehicle having excellent impact resistance and high reliability can be obtained by providing the electronic device of the present invention.

DESCRIPTION OF EMBODIMENTS

Hereinafter, embodiments of the present invention will be described in detail based on the drawings. In addition, in each drawing illustrated below, since each configuration element has a size to the extent of being recognizable on the drawings, the dimensions or ratio of each configuration element are described being appropriately made different from those of real configuration elements in some cases.

Electronic Device
First Embodiment

First, an example of an electronic device according to a first embodiment of the present invention will be described with reference to FIGS. 1 and 2, using an oscillator 1 provided with a vibration element 30 as an example.

Figure 1:
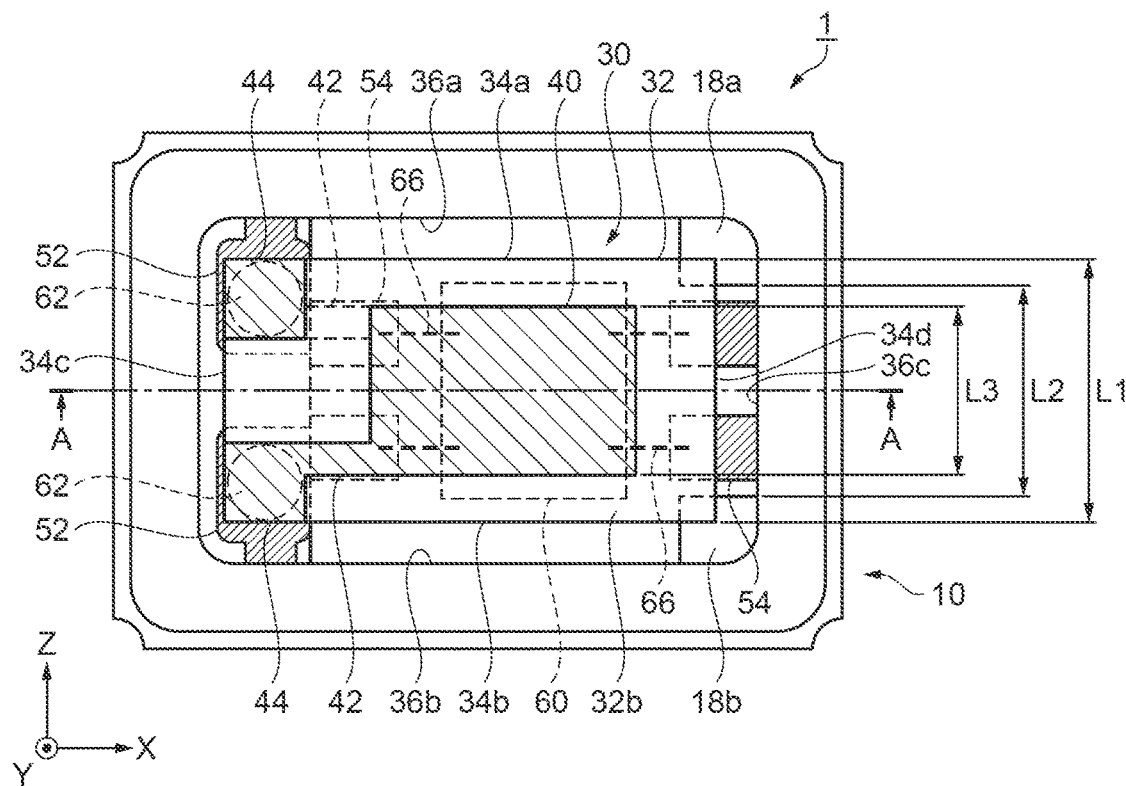
FIG. 1 is a schematic plan view illustrating a structure of an oscillator according to a first embodiment of the present invention.

FIG. 1 is a schematic plan view illustrating a structure of an oscillator according to the first embodiment of the present invention. FIG. 2 is a sectional view taken along line A-A in FIG. 1. In addition, in the following schematic plan views including FIG. 1, for convenience of description, a lid member 16 will be omitted. In addition, in each of the following drawings including FIG. 1, for convenience of description, an X-axis, a Y-axis, and a Z-axis are illustrated as three axes which are orthogonal to each other, and a tip end side and a base end side of an arrow are respectively illustrated as "+ side" and "− side" in the drawing. In addition, hereinafter, the direction parallel to the X-axis is referred to as "X-axis direction", the direction parallel to the Y-axis is referred to as "Y-axis direction, and the direction parallel to the Z-axis is referred to as "Z-axis direction". Furthermore, for convenience of description, a view when viewed from the Y-axis direction is referred to as "plan view", and in a plan view, a surface in the Y-axis direction is described as a main surface, a surface in the +Y-axis direction is an upper surface, and a surface in the −Y-axis direction is described as a lower surface.

Oscillator

Figure 2:
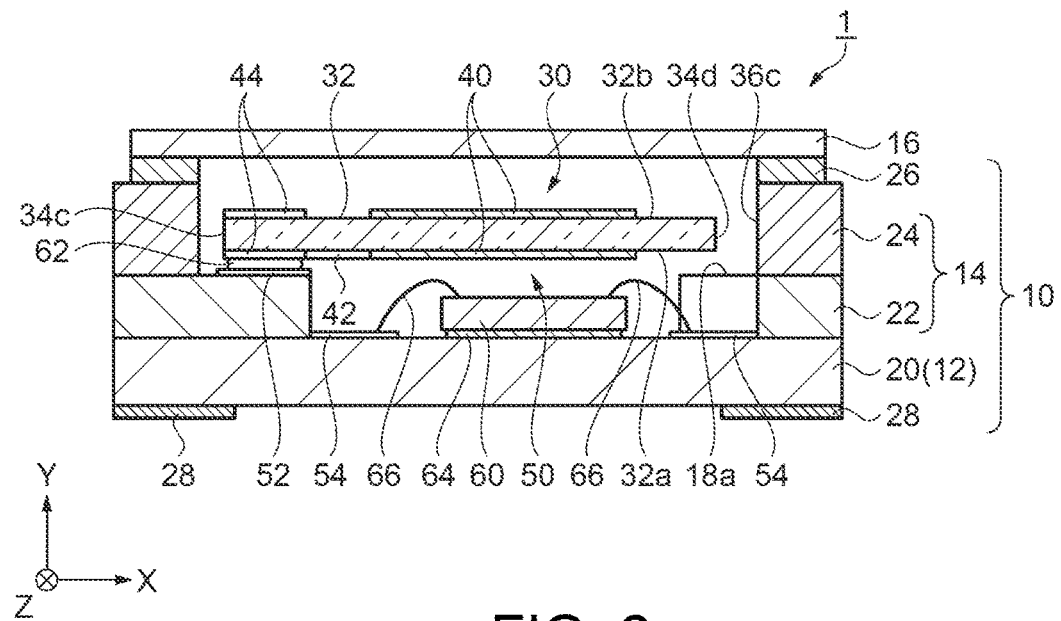
FIG. 2 is a sectional view taken along line A-A in FIG. 1.

As illustrated in FIGS. 1 and 2, the oscillator 1 includes a container 10, the vibration element 30 accommodated in a cavity 50 of the container 10, and an IC chip 60 which serves as an electronic component. In addition, the cavity 50 which accommodates the vibration element 30 and the IC chip 60 is air-tightly sealed in an inert gas atmosphere, such as nitrogen or argon gas, or in a substantially vacuum pressure-reduced atmosphere.

Container

The container 10 is formed by stacking a first substrate 20 which becomes a bottom plate 12, and a frame-like second substrate 22 and a third substrate 24 in which a center portion which becomes a side wall 14 is removed. A plurality of external terminals 28 are formed on a lower surface of the first substrate 20 (bottom plate 12), and a frame-like sealing member 26 is formed on an upper surface of the third substrate 24. In addition, the cavity 50 which is an accommodation space which accommodates the vibration element 30 and the IC chip 60 is configured of a region surrounded by the bottom plate 12 and the side wall 14, and the lid member 16 bonded by the sealing member 26.

A plurality of connection terminals 54 for electric connection with the IC chip 60 are formed on the cavity 50 side which is an upper surface of the first substrate 20 (bottom plate 12), and the vibration element 30 is loaded and a plurality of connection terminals 52 for the electric connection are formed on the upper surface of a region which does not overlap the third substrate 24 of the second substrate 22. In addition, at least one of the connection terminals 52 and 54, and the external terminal 28 provided on the lower surface of the first substrate 20 (bottom plate 12), are electrically connected to each other via a penetrating electrode or an interlayer wiring which is not illustrated.

A first projection portion 18a and a second projection portion 18b are provided in a region surrounded by the side wall 14 on the upper surface of the first substrate 20 (bottom plate 12), in the container 10. In addition, the first projection portion 18a and the second projection portion 18b are formed to be integrated with the second substrate 22 which configures the side wall 14, and are disposed on the upper surface of the first substrate 20 (bottom plate 12).

Vibration Element

The vibration element 30 includes a substrate 32 in which a shape in a plan view is a shape of a rectangular plate, and which is configured of a piezoelectric material, such as quartz crystal, and an electronic film, such as an excitation electrode 40 disposed on a first surface 32a and a second surface 32b which become front and rear surfaces of a main surface of the substrate 32, a pad electrode 44, and a lead electrode 42 which electrically connects the excitation electrode 40 and the pad electrode 44 to each other. In addition, two pad electrodes 44 are formed respectively on the first surface 32a and the second surface 32b of the substrate 32 at both ends of the end portion of the substrate 32 in the longitudinal direction (X-axis direction), and are disposed to overlap each other in a plan view. The overlapped pad electrodes 44 are electrically connected to each other by the electrode film via a side surface of the substrate 32. The vibration element 30 vibrates at a predetermined resonance frequency by applying predetermined AC voltage to the excitation electrode 40 via the connection terminal 52 provided in the container 10.

In the embodiment, the substrate 32 is described using a quartz crystal element plate which mainly performs thickness bending vibration as an example. The substrate 32 uses the quartz crystal element plate which is cut out at a cut angle which is called a AT cut. In addition, the AT cut is cut out to have a main surface (main surface including the X-axis and the Z'-axis) obtained by rotating a plane (Y surface) including the X-axis and the Z-axis which are crystal axes of the quartz crystal for approximately 15 minutes at approximately 35 degrees counterclockwise from the Z-axis around the X-axis. In addition, the longitudinal direction of the substrate 32 matches the X-axis which is the crystal axis of the quartz crystal.

The vibration element 30 includes a first side surface 34a and a second side surface 34b which are disposed to face each other, and a third side surface 34c and a fourth side surface 34d which extend in the direction intersecting the first side surface 34a and the second side surface 34b, as side surfaces which connect the first surface 32a and the second surface 32b of the substrate 32 to each other. The vibration element 30 positions the pad electrode 44 provided in the end portion on the third side surface 34c side on the first surface 32a, and the connection terminal 52 formed on the upper surface of the region which does not overlap the third substrate 24 of the second substrate 22 of the container 10, is placed on the inside of the container 10 via a connection member 62, such as a conductive adhesive, and is electrically connected to the inside of the container 10. In addition, the end portion on the first surface 32a on the fourth side surface 34d side which faces the third side surface 34c is not placed in the container 10. Accordingly, the vibration element 30 is placed on the inside of the container 10 by a cantilever structure in which the end portion on the third side surface 34c side on the first surface 32a is a fixing end portion and the end portion on the fourth side surface 34d side on the first surface 32a is a free end portion.

IC Chip

The IC chip 60 which serves as the electronic component includes an oscillation circuit for vibrating the vibration element 30. Therefore, by suppressing the vibration of the vibration element 30 by the IC chip 60, it is possible to extract a signal of a predetermined resonance frequency from the vibration element 30.

The IC chip 60 is placed via a connection member 64, such as an adhesive, in a region surrounded by the second substrate 22 which configures the side wall 14 on the upper surface of the first substrate 20 (bottom plate 12), and is electrically connected to the connection terminal 54 formed on the upper surface of the first substrate 20 (bottom plate 12) via a bonding wire 66. In addition, the IC chip 60 and the connection terminal 54 may be electrically connected to each other via a metal bump, such as gold (Au) or solder, other than the bonding wire 66.

Next, a positional relationship between the first projection portion 18a and the second projection portion 18b, and the vibration element 30 which are disposed on the inside of the container 10, will be described.

The first projection portion 18a and the second projection portion 18b are projected toward the region surrounded by the side wall 14 from the side wall 14 (third side wall portion 36c) on the fourth side surface 34d side of the vibration element 30, and are disposed on the upper surface of the first substrate 20 (bottom plate 12). The first projection portion 18a is disposed along a first side wall portion 36a on the first side surface 34a side of the vibration element 30 in a plan view, and the second projection portion 18b is disposed along a second side wall portion 36b on the second side surface 34b side of the vibration element 30 in a plan view. In addition, the first projection portion 18a and the second projection portion 18b, and the first surface 32a of the vibration element 30 are disposed to face each other having a void therebetween. Furthermore, the first projection portion 18a and the second projection portion 18b are disposed along the direction in which the first side surface 34a and the second side surface 34b intersect each other at a position at which a part thereof overlaps the first surface 32a on the fourth side surface 34d side of the vibration element 30, and at a position which does not overlap the electrode film which is the excitation electrode 40 on the first surface 32a of the vibration element 30, in a plan view.

In this configuration, since the first projection portion 18a and the second projection portion 18b are disposed to partially overlap the vibration element 30 on the free end portion side of the vibration element 30 at two locations, it is possible to support the free end portion of the vibration element 30 which is displaced as the impact is applied to the vibration element 30 at two overlapped locations. Therefore, it is possible to further reduce damage of the vibration element 30 generated as the free end portion of the vibration element 30 is largely displaced due to the impact.

In addition, since the first projection portion 18a and the second projection portion 18b do not overlap the electrode film which configures the excitation electrode 40, it is possible to reduce a concern about damage of the excitation electrode 40 due to contact of the first projection portion 18a and the second projection portion 18b with the excitation electrode 40. Therefore, it is possible to reduce a change in the reference frequency or deterioration of temporal change characteristics. Accordingly, the oscillator 1 having excellent impact resistance and stable oscillation characteristics can be obtained.

Above, in the description, the quartz crystal element plate of the AT cut is described as an example, but the cut angle is not particularly limited, and may be a Z cut or a BT cut. In addition, the shape of the substrate 32 is not particularly limited, and may be the shape, such as a two-legged tuning fork, an H-shaped tuning fork, a three-legged tuning fork, a comb teeth shape, an orthogonal shape, or a prism shape, as long as a cantilever structure having the fixing end portion and the free end portion is loaded. In addition, as the vibration element 30, other than the AT cut, the Z cut, and BT cut, a quartz crystal vibration element which uses the quartz crystal as a substrate material, for example, a quartz crystal vibration element of a SC cut may be employed, and a vibration element which uses other substrate materials, such as a surface acoustic wave (SAW) resonator piece or a micro electro mechanical systems (MEMS) vibration element, may be employed. In addition, as the substrate material of the vibration element 30, the SAW resonator piece, or the MEMS vibration element, other than the quartz crystal, a piezoelectric single crystal, such as lithium tantalite or lithium niobate, a piezoelectric material, such as piezoelectric ceramics (for example, lead zirconate titanate), or a silicon semiconductor material may be used. As excitation means, such as the vibration element 30, the SAW resonator piece, or the MEMS vibration element, means having a piezoelectric effect may be used, or an electrostatic driving by Coulomb force may be used.

Next, configuration materials of each component which configures the container 10 will be described.

The configuration material of the first substrate 20 which becomes the bottom plate 12, or the frame-like second substrate 22 and the third substrate 24 in which the center portion which becomes the side wall 14 is removed, which are for forming the container 10, is not particularly limited as long as the configuration material has insulation properties. For example, various types of ceramics including oxide-based ceramics (for example, alumina, silica, titanium, or zirconia), nitride based ceramics (for example, silicon nitride, aluminum nitride, or titanium nitride), or carbide-based ceramics (for example, silicon carbide); glass; or a resin, can be employed.

The configuration material of the external terminal 28 or the connection terminals 52 and 54 is not particularly limited, and for example, a metal material, such as gold (Au), gold alloy, platinum (Pt), aluminum (Al), aluminum alloy, silver (Ag), silver alloy, chrome (Cr), chrome alloy, nickel (Ni), copper (Cu), molybdenum (Mo), niobium (Nb), tungsten (W), iron (Fe), titanium (Ti), cobalt (Co), zinc (Zn), and zirconium (Zr), or an alloy combined by these materials, can be employed.

The lid member 16 is a member made by processing glass, ceramics, and a metal flat plate, and mainly has a shape of a flat plate. In addition, the configuration material of the lid member 16 is not particularly limited, but it is preferable to use an inorganic material or a metal material having a linear expansion coefficient which is similar to that of the configuration material of the container 10. Therefore, for example, in a case where the container 10 is a ceramics substrate, as the configuration material of the lid member 16, it is preferable to use an alloy including a Fe—Ni—Co-based alloy, such as cobalt, or an alloy including a Fe—Ni alloy, such as 42 alloy.

The electrode film, such as the excitation electrode 40, the lead electrode 42, and the pad electrode 44, which are formed on the substrate 32 of the vibration element 30, is configured of two layers including a lower ground layer and an upper layer.

Examples of the configuration material of the lower ground layer include a material having adhesiveness to the substrate 32, and specifically include metal elements, such as chrome (Cr), nickel (Ni), titanium (Ti), tungsten (W), silver (Ag), or aluminum (Al); or a mixture or an ally of one or more types thereof.

Meanwhile, examples of the configuration material of the upper layer includes a material having particularly high electrical conductivity, and specifically include precious metal elements, such as gold (Au), platinum (Pt), and silver (Ag); or a mixture or an alloy of one or more types thereof.

Next, regarding a positional relationship with the vibration element 30 or the excitation electrode 40, a relationship of L1 >L2 >L3 is satisfied when an interval between the end portion of the first side surface 34a and the end portion of the second side surface 34b of the vibration element 30 in the Z-axis direction is L1, an interval between the end portion opposite to the second projection portion 18b of the first projection portion 18a and the end portion opposite to the first projection portion 18a of the second projection portion 18b in the Z-axis direction is L2, and an interval between the end portion on the first side surface 34a side and the end portion on the second side surface 34b side of the excitation electrode 40 formed on the first surface 32a of the vibration element 30 which is the electronic film in the Z-axis direction is L3, in a plan view.

In the relationship of each dimension, by satisfying L1 >L2, when the impact is applied to the vibration element 30, the first projection portion 18a and the second projection portion 18b can support the free end portion of the vibration element 30. Therefore, it is possible to reduce a concern about damage of the vibration element 30 generated as the free end portion of the vibration element 30 is largely displaced due to the impact. In addition, by satisfying L2 >L3, when the impact is applied to the vibration element 30, the first projection portion 18a and the second projection portion 18b come into contact with the electrode film which configures the excitation electrode 40, and it is possible to reduce a concern about damage of the excitation electrode 40. Therefore, it is possible to reduce a change in the reference frequency or deterioration of temporal change characteristics. In addition, since the vibration element 30, the excitation electrode 40, the first projection portion 18a, and the second projection portion 18b are disposed as described above, for example, even when the excitation electrode 40 extends in the direction of the fourth side surface 34d in order to reduce the equivalent series resistance of the vibration element 30, it is possible to reduce a concern that the excitation electrode 40 comes into contact with the first projection portion 18a and the second projection portion 18b. Therefore, when the impact is applied to the vibration element 30, it is possible to reduce a concern about damage of the excitation electrode 40 due to contact of the first projection portion 18a and the second projection portion 18b with the electrode film which configures the excitation electrode 40. Therefore, it is possible to reduce a change in the reference frequency or deterioration of temporal change characteristics.

Next, when the position of the first projection portion 18a and the second projection portion 18b which are disposed in a range surrounded by the side wall 14 will be described in detail, the first projection portion 18a is disposed toward the direction of the third side surface 34c of the vibration element 30 from a region in which the first side wall portion 36a and the third side wall portion 36c of the side wall 14 are connected to each other, and the second projection portion 18b is disposed toward the direction of the third side surface 34c of the vibration element 30 from the region in which the second side wall portion 36b and the third side wall portion 36c of the side wall 14 are connected to each other.

By disposing the portions in this manner, since the first projection portion 18a and the second projection portion 18b are disposed toward the direction of the third side surface 34c of the vibration element 30 from the third side wall portion 36c of the container 10, it is possible to elongate the part which overlaps the vibration element 30 along the direction of linking the free end portion and the fixing end portion of the vibration element 30. Therefore, when the impact is applied to the vibration element 30, it is possible to support the free end portion side of the vibration element 30 which is largely displaced in a longer range. Therefore, it is possible to reduce a concern about damage of the vibration element 30 generated as the free end portion of the vibration element 30 is largely displaced due to the impact. In addition, since the first projection portion 18a is disposed in a region in which the first side wall portion 36a and the third side wall portion 36c of the side wall 14 are connected to each other, and the second projection portion 18b is disposed in a region in which the second side wall portion 36b and the third side wall portion 36c of the side wall 14 are connected to each other, in the connection portion between the first side wall portion 36a and the third side wall portion 36c, and the connection portion between the second side wall portion 36b and the third side wall portion 36c, in the side wall 14 of the container 10, the distance from the outer circumference of the container 10 becomes large, and thus, an effect that the strength of the container 10 increases.

Second Embodiment

An oscillator 1a which serves as the electronic device according to a second embodiment of the present invention will be described with reference to FIGS. 3 and 4.

Figure 3:
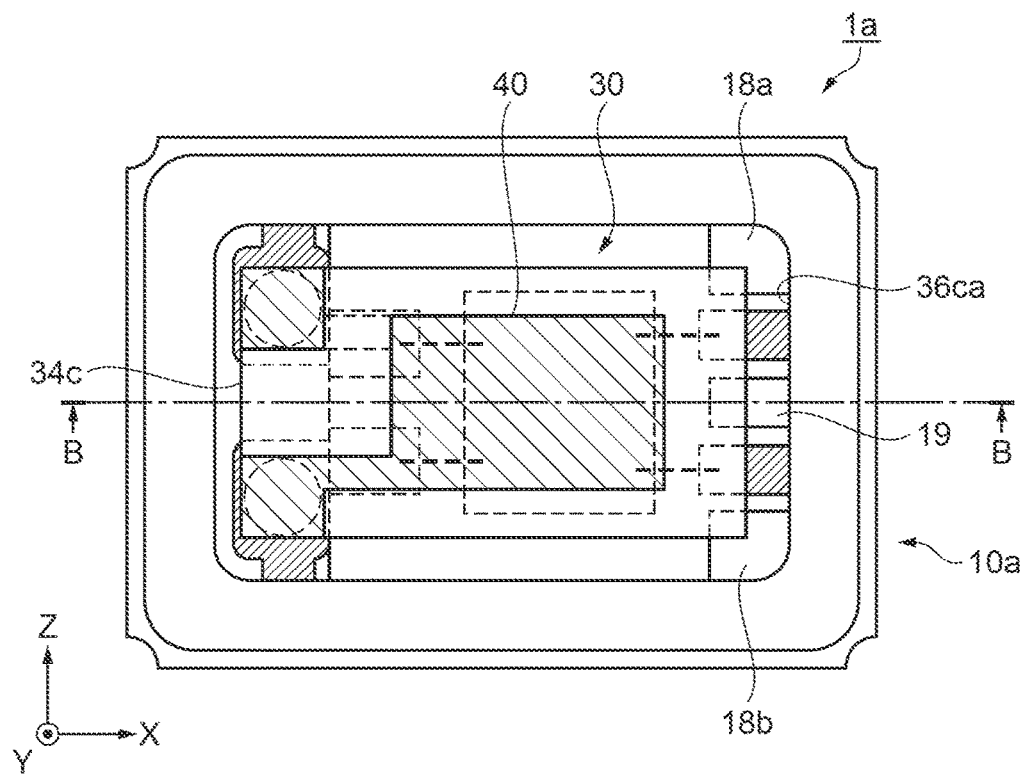
FIG. 3 is a schematic plan view illustrating a structure of an oscillator according to a second embodiment of the present invention.

FIG. 3 is a schematic plan view illustrating a structure of the oscillator according to the second embodiment of the present invention. FIG. 4 is a sectional view taken along line B-B in FIG. 3.

The oscillator 1a according to the second embodiment is different from the oscillator 1 described in the first embodiment in that a third projection portion 19 which is another projection portion is disposed between the first projection portion 18a and the second projection portion 18b.

Since other configurations are substantially the same as those of the above-described oscillator 1 in the first embodiment, the oscillator 1a will be described while similar configuration elements are given the same reference numerals and numbers, and the description thereof is partially omitted.

Figure 4:
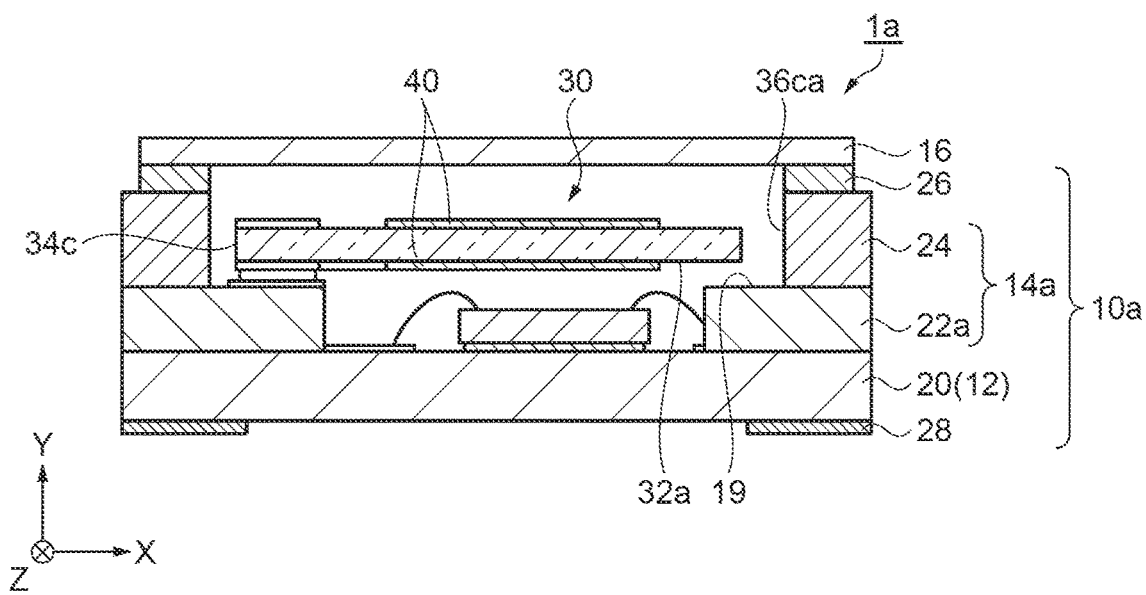
FIG. 4 is a sectional view taken along line B-B in FIG. 3.

In the oscillator 1a, as illustrated in FIGS. 3 and 4, the third projection portion 19 which is another projection portion is disposed between the first projection portion 18a and the second projection portion 18b on the upper surface of the first substrate 20 (bottom plate 12) of a container 10a. The third projection portion 19 is integrated with a second substrate 22a, and is disposed toward the third side surface 34c direction of the vibration element 30 from a third side wall portion 36ca of a side wall 14a. In addition, in the third projection portion 19, the third projection portion 19 and the first surface 32a of the vibration element 30 are disposed to face each other having a void therebetween, and the third projection portion 19 partially overlaps the vibration element 30, and is disposed at a position which does not overlap the electrode film which is the excitation electrode 40 on the first surface 32a of the vibration element 30.

In this configuration, in a case where the free end portion of the vibration element 30 is largely displaced due to the impact, since it is possible to support the free end portion of the vibration element 30 at three locations including the first projection portion 18a, the second projection portion 18b, and the third projection portion 19, it is possible to further reduce damage of the vibration element 30 due to the impact. In addition, since it is possible to reduce damage of the excitation electrode 40, it is possible to reduce a change in the reference frequency or deterioration of temporal change characteristics. Accordingly, it is possible to obtain the oscillator 1a having excellent impact resistance and stable oscillation characteristics.

Third Embodiment

An oscillator 1b which serves as the electronic device according to a third embodiment of the present invention will be described with reference to FIGS. 5 and 6.

Figure 5:
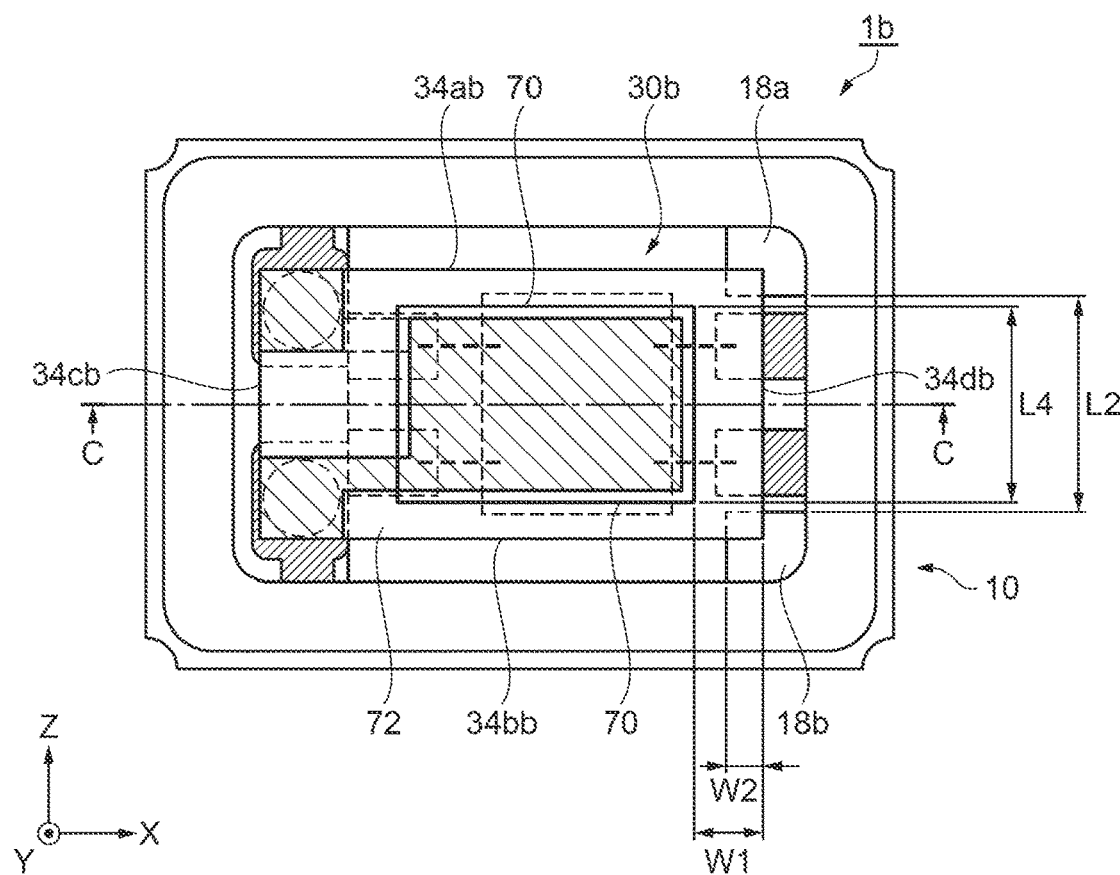
FIG. 5 is a schematic plan view illustrating a structure of an oscillator according to a third embodiment of the present invention.

FIG. 5 is a schematic plan view illustrating a structure of the oscillator according to the third embodiment of the present invention. FIG. 6 is a sectional view taken along line C-C in FIG. 5.

The oscillator 1b according to the third embodiment is different from the oscillator 1 described in the first embodiment in the shape of the vibration element 30b which is placed in the container 10.

Since other configurations are substantially the same as those of the above-described oscillator 1 in the first embodiment, the oscillator 1b will be described while similar configuration elements are given the same reference numerals and numbers, and the description thereof is partially omitted.

Figure 6:
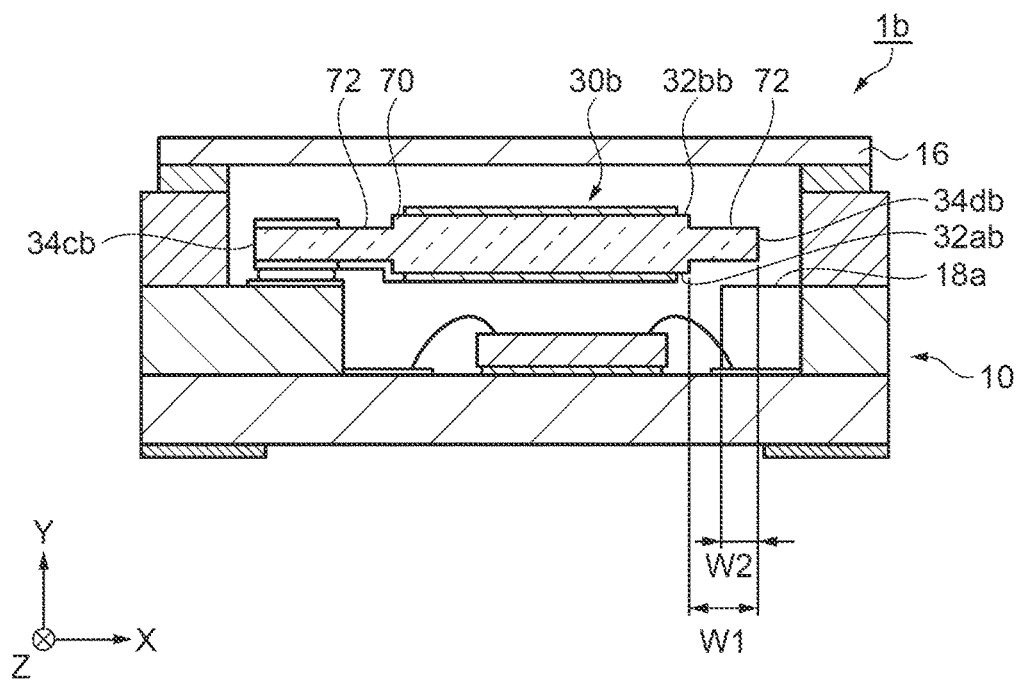
FIG. 6 is a sectional view taken along line C-C in FIG. 5.

As illustrated in FIGS. 5 and 6, the oscillator 1b has a different shape of a vibration element 30b placed in the container 10. The vibration element 30b includes a first region 70 having a first thickness on a first surface 32ab and a second surface 32bb in the normal line direction of the first surface 32ab, and a second region 72 having a second thickness which is thinner than that of the first region 70 in the normal line direction of the first surface 32ab on the outer circumference of the first region 70. In other words, the shape of the vibration element 30b is a shape which has the first region 70 in which the plate thickness of the center portion is thick, and which is generally called a mesa type structure. Since the vibration element 30b of the mesa type structure can confine vibration energy in the first region 70, it is possible to reduce vibration leakage in which the vibration energy leaks to the container 10 via the fixing end portion of the vibration element 30b, and to have a high Q value.

The positional relationship between the vibration element 30b, and the first projection portion 18a and the second projection portion 18b satisfies a relationship of $L2 > L4$ and $W1 > W2$ when an interval between the end portion opposite to the second projection portion 18b of the first projection portion 18a and the end portion opposite to the first projection portion 18a of the second projection portion 18b is $L2$, an interval between the end portion on a first side surface 34ab side and the end portion on a second side surface 34bb side of the first region 70 of the vibration element 30b in the Z-axis direction is $L4$, an interval between the end portion of a fourth side surface 34db of the vibration element 30b and the end portion on the fourth side surface 34db side of the first region 70 in the Z-axis direction is $W1$, and a longer interval among an interval between the end portion of the fourth side surface 34db of the vibration element 30b and the end portion on a third side surface 34cb side of the first projection portion 18a of the container 10 in the X-axis direction, and an interval between the end portion of the fourth side surface 34db and the end portion on the third side surface 34cb side of the second projection portion 18b of the container 10 in the X-axis direction is $W2$.

In the relationship of each dimension of the vibration element 30b of the mesa type structure having the first region 70, by satisfying the relationship of $L2 > L4$ and $W1 > W2$, it is possible to reduce a concern about damage of the first region 70 of the vibration element 30b due to contact of the first projection portion 18a and the second projection portion 18b come into contact with the first region 70 of the vibration element 30b. Accordingly, it is possible to obtain the oscillator 1b which has excellent impact resistance and high Q value, and stably oscillates.

Next, modification examples of the electronic device according to the first to the third embodiments of the present invention will be described.

Modification Example 1

An oscillator 1c which serves as the electronic device according to a modification example 1 of the embodiments of the present invention will be described with reference to FIGS. 7 and 8.

Figure 7:
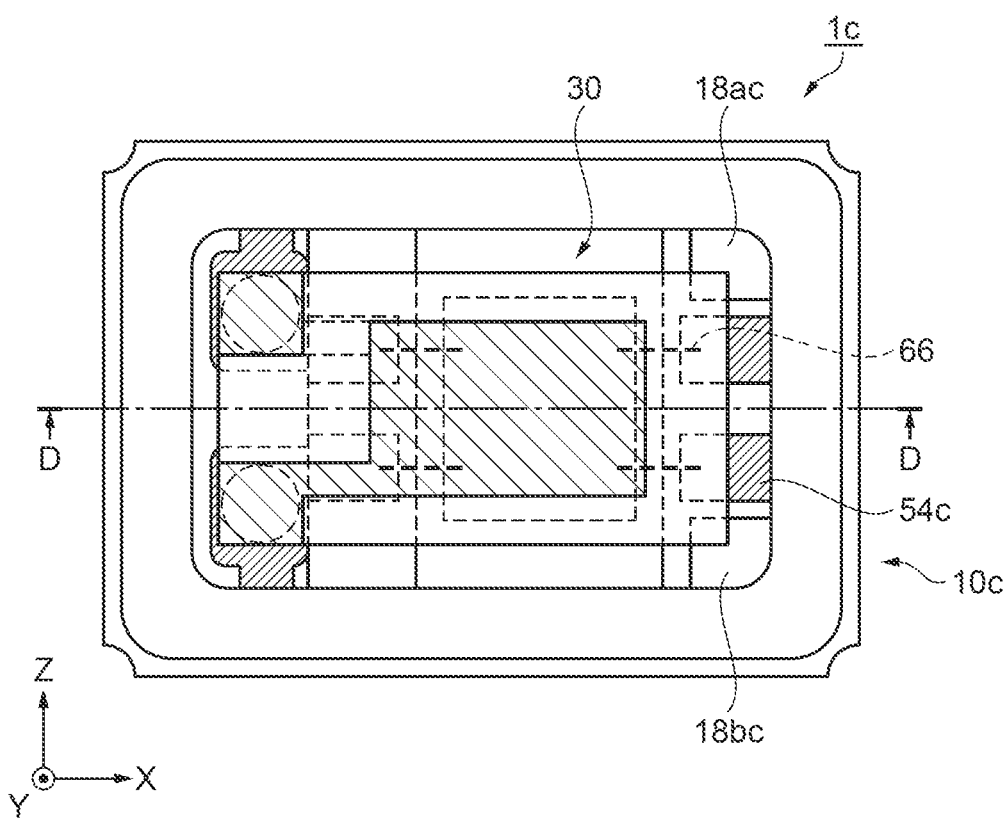
FIG. 7 is a schematic plan view illustrating a structure of an oscillator according to a modification example 1 of the embodiments of the present invention.

FIG. 7 is a schematic plan view illustrating a structure of the oscillator according to the modification example 1 of the embodiments of the present invention. FIG. 8 is a sectional view taken along line D-D in FIG. 7.

The oscillator 1c according to the modification example 1 is different in a configuration of a container 10c and in that a fourth substrate 21 is provided between a first substrate 20c and a second substrate 22c, compared to the oscillator 1 described in the first embodiment.

Since other configurations are substantially the same as those of the above-described oscillator 1 in the first embodiment, the oscillator 1c will be described while similar configuration elements are given the same reference numerals and numbers, and the description thereof is partially omitted.

Figure 8:
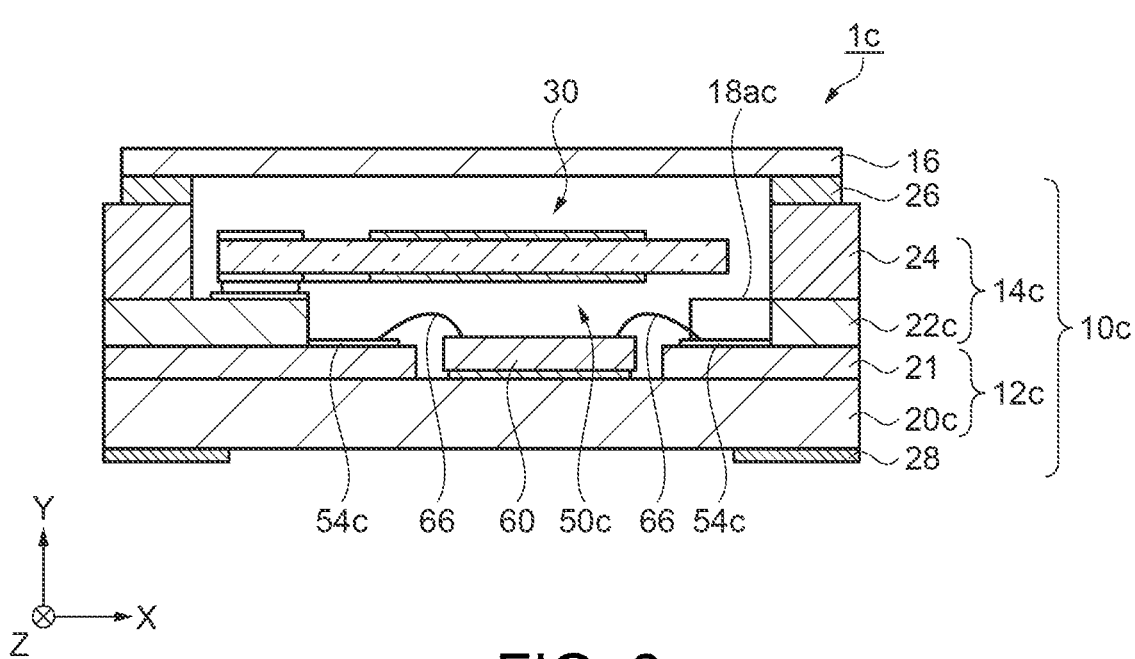
FIG. 8 is a sectional view taken along line D-D in FIG. 7.

In the oscillator 1c, as illustrated in FIGS. 7 and 8, a bottom plate 12c of the container 10c is configured of two layers including the first substrate 20c and the frame-like fourth substrate 21 in which the center portion is removed, and the IC chip 60 is loaded in a region surrounded by the fourth substrate 21 on the upper surface of the first substrate 20c. A first projection portion 18ac and a second projection portion 18bc are integrated with the second substrate 22c, and are disposed on the upper surface of the fourth substrate 21. By disposing the third substrate 24 on the upper surface of the second substrate 22c, a side wall 14c is formed, and a cavity 50c which accommodates the vibration element 30 is configured. The IC chip 60 is electrically connected to a connection terminal 54c formed on the upper surface of the fourth substrate 21 via the bonding wire 66.

In this configuration, since it is possible to widen the void between the IC chip 60 and the vibration element 30, it is possible to reduce the contact between the bonding wire 66 and the vibration element 30 which are connected to the IC chip 60, and to obtain the oscillator 1c having excellent impact resistance and high reliability.

Modification Example 2

An oscillator 1d which serves as the electronic device according to a modification example 2 of the embodiments of the present invention will be described with reference to FIGS. 9 and 10.

Figure 9:
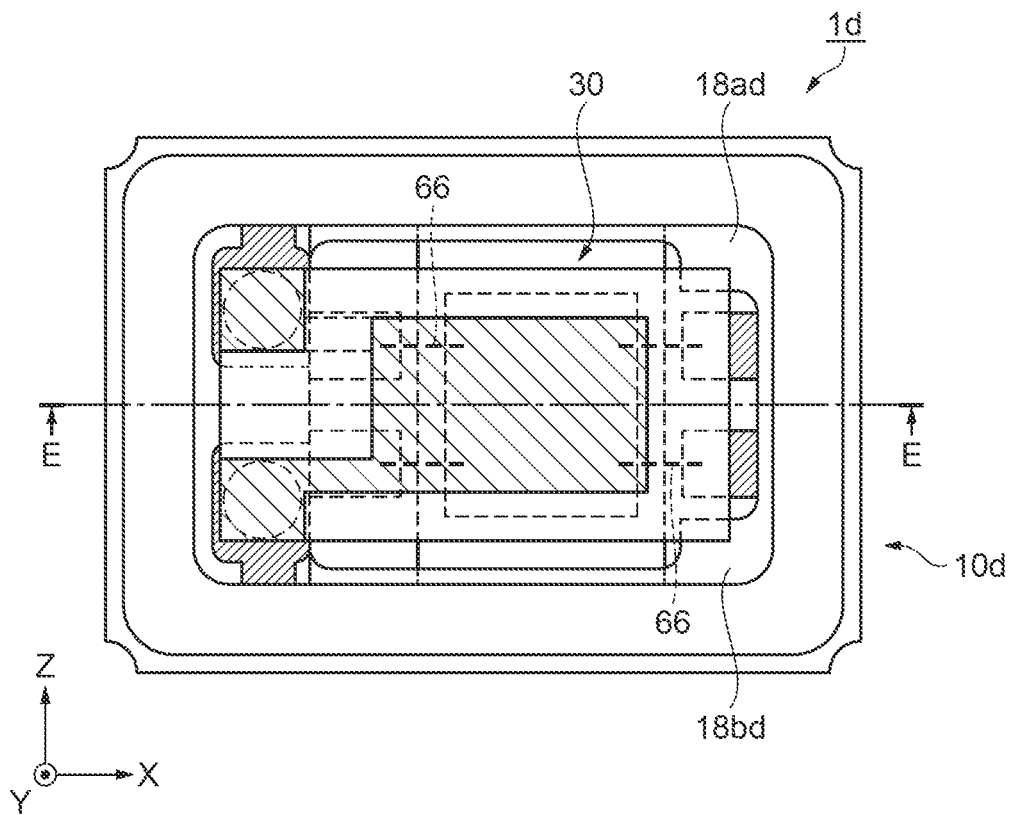
FIG. 9 is a schematic plan view illustrating a structure of an oscillator according to a modification example 2 of the embodiments of the present invention.

FIG. 9 is a schematic plan view illustrating a structure of the oscillator according to the modification example 2 of the embodiments of the present invention. FIG. 10 is a sectional view taken along line E-E in FIG. 9.

The oscillator 1d according to the modification example 2 is different in a configuration of a container 10d, and in that the fourth substrate 21 is provided between the first substrate 20c and a second substrate 22d and there are many regions in which the second substrate 22d and the third substrate 24 which configure a side wall 14d do not overlap each other in a plan view, compared to the oscillator 1 described in the first embodiment.

Since other configurations are substantially the same as those of the above-described oscillator 1 in the first embodiment, the oscillator 1d will be described while similar configuration elements are given the same reference numerals and numbers, and the description thereof is partially omitted.

Figure 10:
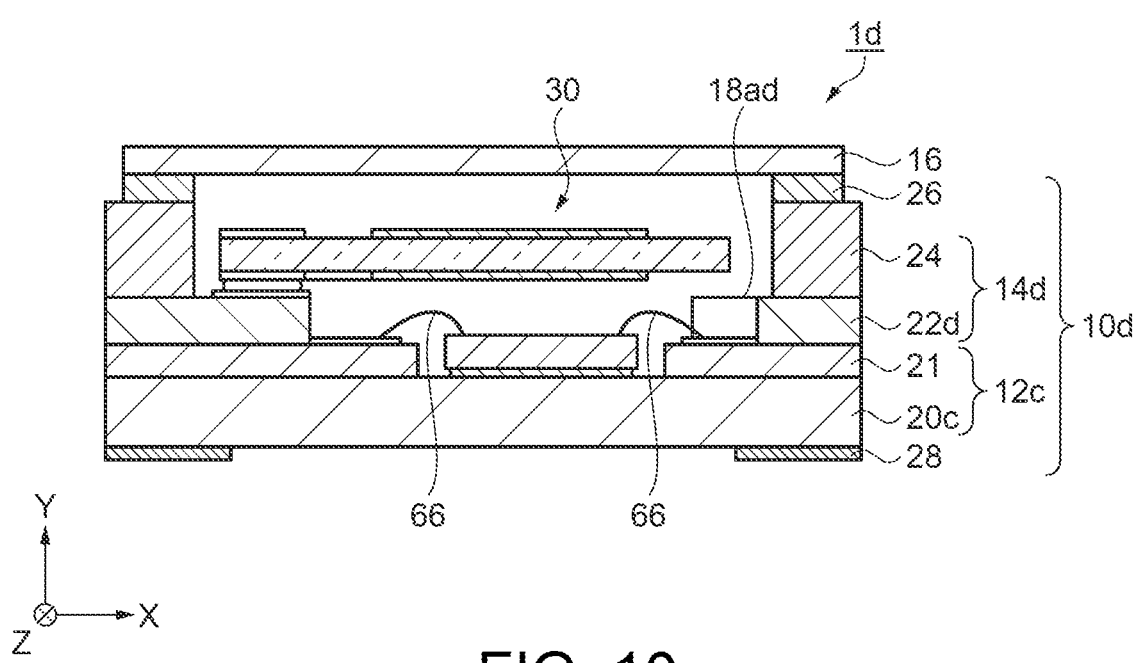
FIG. 10 is a sectional view taken along line E-E in FIG. 9.

In the oscillator 1d, as illustrated in FIGS. 9 and 10, the bottom plate 12c of the container 10d is configured of two layers including the first substrate 20c and the frame-like fourth substrate 21 in which the center portion is removed, and a first projection portion 18ad and a second projection portion 18bd are integrated with the second substrate 22d, and are disposed on the upper surface of the fourth substrate 21. In the second substrate 22d, the width dimension (the length in the Z-axis direction) of the frame in the direction (Z-axis direction) intersecting the longitudinal direction (X-axis direction) of the vibration element 30, and the width dimension (the length in the Z-axis direction) on the side on which the first projection portion 18ad and the second projection portion 18bd are disposed, are longer compared to the third substrate 24. Therefore, there are many regions in which the second substrate 22d and the third substrate 24 do not overlap each other in a plan view.

In this configuration, since it is possible to thicken the width dimension of the frame of the side wall 14d, it is possible to improve the mechanical strength of the container 10d, and to obtain the oscillator 1d having excellent impact resistance and higher reliability.

Modification Example 3

A vibrator 1e which serves as the electronic device according to a modification example 3 of the embodiments of the present invention will be described with reference to FIGS. 11 and 12.

Figure 11:
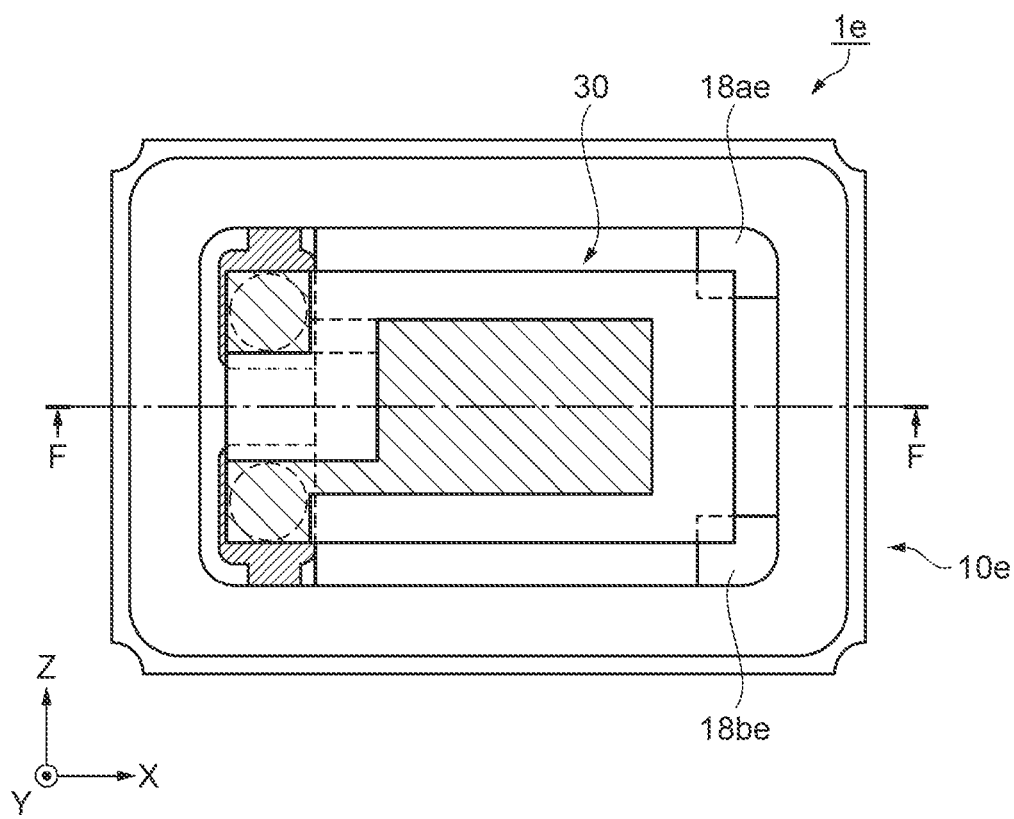
FIG. 11 is a schematic plan view of a structure of a vibrator according to a modification example 3 of the embodiments of the present invention.

FIG. 11 is a schematic plan view illustrating a structure of the oscillator according to the modification example 3 of the embodiments of the present invention. FIG. 12 is a sectional view taken along line F-F in FIG. 11.

The vibrator 1e according to the modification example 3 is different in a configuration of a container 10e, and in that the electronic component (IC chip) is not loaded, compared to the oscillator 1 described in the first embodiment.

Since other configurations are substantially the same as those of the above-described oscillator 1 in the first embodiment, the vibrator 1e will be described while similar configuration elements are given the same reference numerals and numbers, and the description thereof is partially omitted.

Figure 12:
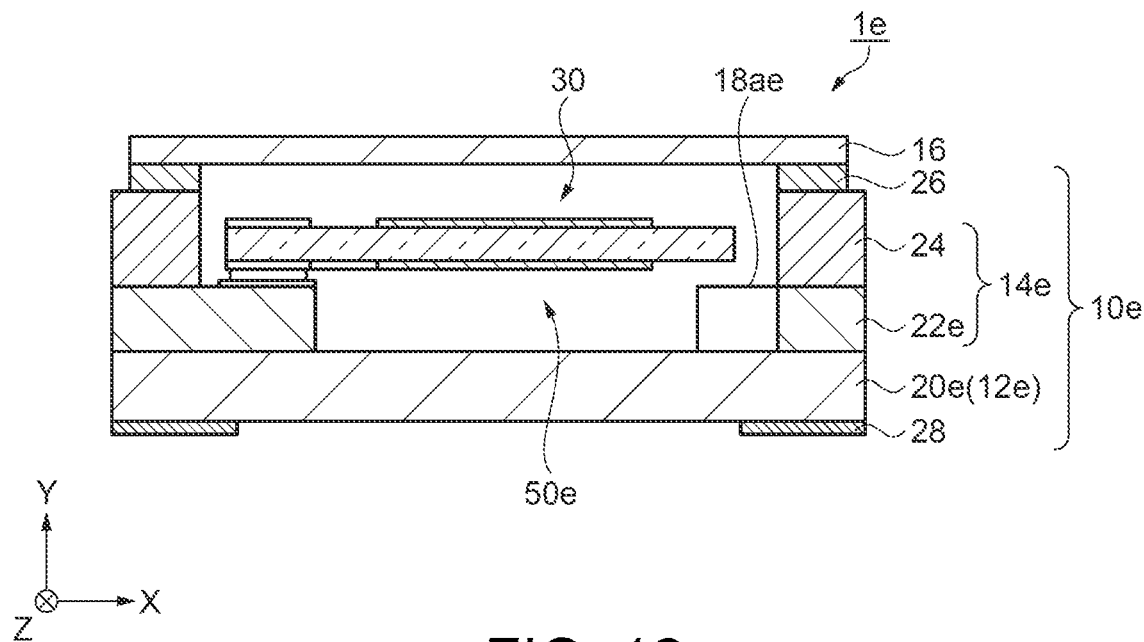
FIG. 12 is a sectional view taken along line F-F in FIG. 11.

As illustrated in FIGS. 11 and 12, the vibrator 1e includes the container 10e and the vibration element 30 accommodated in a cavity 50e of the container 10e. In addition, the cavity 50e which accommodates the vibration element 30 is air-tightly sealed in an inert gas atmosphere, such as nitrogen or argon gas, or in a substantially vacuum pressure-reduced atmosphere. The container 10e is formed by stacking a first substrate 20e which becomes a bottom plate 12e and a frame-like second substrate 22e and the third substrate 24 which become a side wall 14e and in which the center portion is removed. A first projection portion 18ae and a second projection portion 18be are integrally formed with the second substrate 22e which configures the side wall 14e, and are disposed on the upper surface of the first substrate 20e (bottom plate 12e). In addition, the cavity 50e which is the accommodation space which accommodates the vibration element 30 is configured of a region surrounded by the bottom plate 12e and the side wall 14e, and the lid member 16 bonded by the sealing member 26.

In this configuration, since it is possible to make the plate thickness (the length in the Y-axis direction) of the second substrate 22e thin, it is possible to obtain the vibrator 1e in which the container 10e is made thin, and which has excellent impact resistance and high reliability with the thin shape.

Fourth Embodiment

First, an oscillator 101 provided with the vibration element 30 will be described as an example of the electronic device according to the fourth embodiment of present invention with reference to FIGS. 13 and 14.

Figure 13:
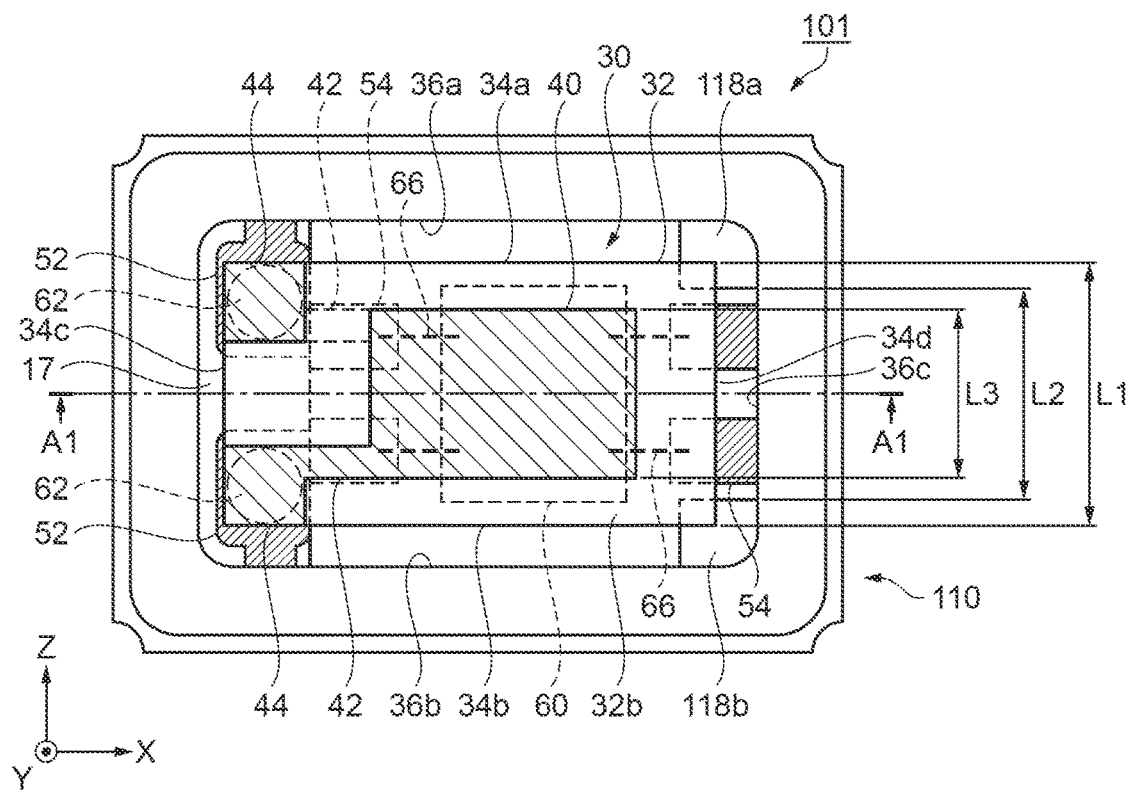
FIG. 13 is a schematic plan view illustrating a structure of an oscillator according to a fourth embodiment of the present invention.

FIG. 13 is a schematic plan view illustrating a structure of the oscillator according to the fourth embodiment of the present invention. FIG. 14 is a sectional view taken along line A1-A1 in FIG. 13.

Similar configuration elements to those of the oscillator 1 of the above-described first embodiment are given the same reference numerals and numbers.

Oscillator

Figure 14:
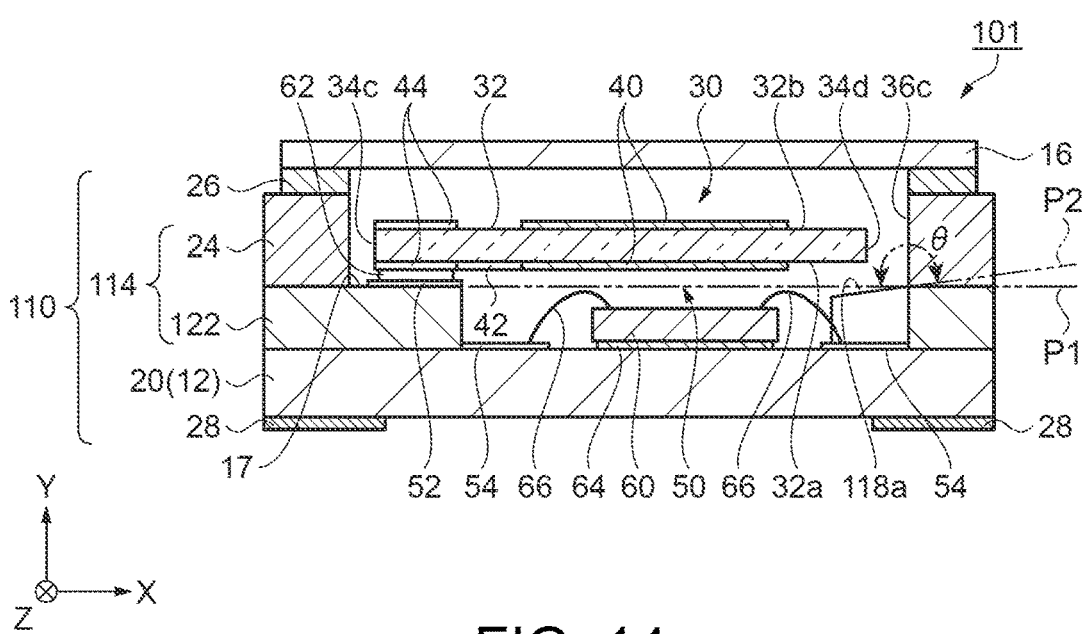
FIG. 14 is a sectional view taken along line A1-A1 in FIG. 13.

As illustrated in FIGS. 13 and 14, the oscillator 101 includes a container 110, the lid member 16, the vibration element 30 accommodated in the cavity 50 configured of the container 110 and the lid member 16, and the IC chip 60 which serves as the electronic component. In addition, the cavity 50 which accommodates the vibration element 30 and the IC chip 60 is air-tightly sealed in an inert gas atmosphere, such as nitrogen or argon gas, or in a substantially vacuum pressure-reduced atmosphere.

Container

The container 110 is formed by stacking the first substrate 20 which becomes the bottom plate 12, and a frame-like second substrate 122 and the third substrate 24 which become a side wall 114 and in which the center portion is removed. The plurality of external terminals 28 are formed on the lower surface of the first substrate 20 (bottom plate 12), and the frame-like sealing member 26 is formed on the upper surface of the third substrate 24. In addition, the cavity 50 which is the accommodation space that accommodates the vibration element 30 and the IC chip 60 is configured of a region surrounded by the bottom plate 12 and the side wall 114, and the lid member 16 bonded by the sealing member 26.

The plurality of connection terminals 54 for achieving electric connection with the IC chip 60 are formed on the cavity 50 side which is the upper surface of the first substrate 20 (bottom plate 12), the plurality of connection terminals 52 for placing the vibration element 30 and achieving the electric connection are formed on the upper surface of a loading portion 17 of a region which does not overlap the third substrate 24 of the second substrate 122. In addition, at least one of the connection terminals 52 and 54 and the external terminal 28 provided on the lower surface of the first substrate 20 (bottom plate 12), are electrically connected to each other via the penetrating electrode or the interlayer wiring which is not illustrated.

In the container 110, a first projection portion 118a which is one projection portion, a second projection portion 118b which is the other projection portion, and the loading portion 17 are provided in a region surrounded by the side wall 114 on the upper surface of the first substrate 20 (bottom plate 12). In addition, the first projection portion 118a, the second projection portion 118b, and the loading portion 17 are formed to be integrated with the second substrate 122 which configures the side wall 114, and are disposed on the upper surface of the first substrate 20 (bottom plate 12).

Vibration Element

The vibration element 30 includes the substrate 32 of which the shape in a plan view is a shape of a plate, and which is configured of a piezoelectric material, such as quartz crystal, and the electrode film, such as the excitation electrode 40 which is disposed on the first surface 32a and the second surface 32b which become a front and rear surfaces of the main surface of the substrate 32, the pad electrode 44, and the lead electrode 42 which electrically connects the excitation electrode 40 and the pad electrode 44 to each other. In addition, two pad electrodes 44 are formed respectively on the first surface 32a and the second surface 32b of the substrate 32 at both ends of the end portion of the substrate 32 in the longitudinal direction (X-axis direction), and are disposed to overlap in a plan view. The overlapped pad electrodes 44 are electrically connected to each other by the electrode film via the side surface of the substrate 32. The vibration element 30 vibrates at a predetermined resonance frequency by applying predetermined AC voltage to the excitation electrode 40 via the connection terminal 52 provided in the container 110.

In the embodiment, the substrate 32 is described using a quartz crystal element plate which mainly performs thickness bending vibration as an example. The substrate 32 uses the quartz crystal element plate which is cut out at a cut angle which is called a AT cut. In addition, the AT cut is cut out to have a main surface (main surface including the X-axis and the Z'-axis) obtained by rotating a plane (Y surface) including the X-axis and the Z-axis which are crystal axes of the quartz crystal for approximately 15 minutes at approximately 35 degrees counterclockwise from the Z-axis around the X-axis. In addition, the longitudinal direction of the substrate 32 matches the X-axis which is the crystal axis of the quartz crystal.

The vibration element 30 includes a first side surface 34a and a second side surface 34b which are disposed to face each other, and a third side surface 34c and a fourth side surface 34d which extend in the direction intersecting the first side surface 34a and the second side surface 34b, as side surfaces which connect the first surface 32a and the second surface 32b of the substrate 32 to each other. The vibration element 30 positions the pad electrode 44 provided in the end portion on the third side surface 34c side on the first surface 32a, and the connection terminal 52 formed on the upper surface of the region which does not overlap the third substrate 24 of the second substrate 122 of the container 110, is placed on the loading portion 17 of the container 110 via the connection member 62, such as a conductive adhesive, and is electrically connected to the container 110. In addition, the end portion on the first surface 32a on the fourth side surface 34d side which faces the third side surface 34c is not placed on the loading portion 17. Accordingly, the vibration element 30 is placed on the inside of the container 110 by a cantilever structure in which the end portion on the third side surface 34c side on the first surface 32a is a fixing end portion and the end portion on the fourth side surface 34d side on the first surface 32a is a free end portion.

IC Chip

The IC chip 60 which serves as the electronic component includes an oscillation circuit for vibrating the vibration element 30. Therefore, by suppressing the vibration of the vibration element 30 by the IC chip 60, it is possible to extract a signal of a predetermined resonance frequency from the vibration element 30.

The IC chip 60 is placed via a connection member 64, such as an adhesive, in a region surrounded by the second substrate 122 which configures the side wall 114 on the upper surface of the first substrate 20 (bottom plate 12), and is electrically connected to the connection terminal 54 formed on the upper surface of the first substrate 20 (bottom plate 12) via the bonding wire 66 or the like. In addition, the IC chip and the connection terminal 54 may be electrically connected to each other via a metal bump, such as gold (Au) or solder, other than the bonding wire 66.

Next, a positional relationship between the first projection portion 118a and the second projection portion 118b, and the vibration element 30 which are disposed on the inside of the container 110 in a plan view, and a distance relationship of the first surface 32a of the vibration element 30 in the normal line direction will be described.

The first projection portion 118a and the second projection portion 118b are projected toward the region surrounded by the side wall 114 from the side wall 114 (third side wall portion 36c) on the fourth side surface 34d side of the vibration element 30, and are disposed on the upper surface of the first substrate 20 (bottom plate 12). The first projection portion 118a is disposed along the first side wall portion 36a on the first side surface 34a side of the vibration element 30 in a plan view, and the second projection portion 118b is disposed along the second side wall portion 36b on the second side surface 34b side of the vibration element 30 in a plan view. In addition, the first projection portion 118a and the second projection portion 118b, and the first surface 32a of the vibration element 30 are disposed to face each other having a void therebetween. Furthermore, the first projection portion 118a and the second projection portion 118b are disposed at a position at which at least apart thereof overlaps the first surface 32a on the fourth side surface 34d side of the vibration element 30 in a plan view.

In addition, the distance between the bottom plate 12 and the surface which faces the vibration element 30 of the first projection portion 118a and the second projection portion 118b in the normal line direction (Y-axis direction) is configured to be shortened from the position which overlaps the fourth side surface 34d which is the outer edge portion (outer edge) of the vibration element 30 toward the position which overlaps the inner side portion (inner side) of the vibration element 30. In addition, an angle θ which is made as a first virtual surface P1 which extends on a surface on which the connection member 62 of the loading portion 17 is disposed and a second virtual surface P2 which extends on a surface that faces the vibration element 30 of the first projection portion 118a and the second projection portion 118b intersect each other, is greater than 90 degrees and smaller than 180 degrees. In other words, in the first projection portion 118a and the second projection portion 118b, an inclined surface is provided so that the length of the first projection portion 118a and the second projection portion 118b in the plate thickness direction (Y-axis direction) is gradually shortened from the third side wall portion 36c toward the direction of the third side surface 34c of the vibration element 30. Therefore, the distance between the vibration element 30, and the first projection portion 118a and the second projection portion 118b monotonously elongates from the outer edge portion (fourth side surface 34d side) of the vibration element 30 toward the inner side portion (excitation electrode 40 side or third side surface 34c side), that is, the distance changes in one direction in which the distance elongates.

In this configuration, since the first projection portion 118a and the second projection portion 118b are disposed to partially overlap the vibration element 30 on the free end portion side which is the fourth side surface 34d side of the vibration element 30 at two locations, it is possible to support the free end portion of the vibration element 30 which is displaced as the impact is applied to the vibration element 30 at two overlapped locations. Therefore, it is possible to further reduce a possibility of damage of the vibration element 30 generated as the free end portion of the vibration element 30 is largely displaced due to the impact.

In addition, in the first projection portion 118a and the second projection portion 118b, an inclined surface in which the distance between the vibration element 30, and the first projection portion 118a and the second projection portion 118b monotonously elongates from the outer edge portion (fourth side surface 34d side) of the vibration element 30 toward the inner side portion (excitation electrode 40 side or third side surface 34c side). Therefore, after the free end portion of the vibration element 30 which is displaced as the impact is applied to the vibration element 30 comes into contact with at least one of the first projection portion 118a and the second projection portion 118b, further, even when the vibration element 30 is bent, it is possible to reduce a possibility that the first projection portion 118a and the second projection portion 118b come into contact with the excitation electrode 40. Accordingly, since it is possible to reduce a possibility of damage of the excitation electrode 40, it is possible to reduce a change in the reference frequency or deterioration of temporal change characteristics, and to obtain the oscillator 101 having excellent impact resistance and stable oscillation characteristics.

Above, in the description, the quartz crystal element plate of the AT cut is described as an example, but the cut angle is not particularly limited, and may be a Z cut or a BT cut.

In addition, the shape of the substrate 32 is not particularly limited, and may be the shape, such as a two-legged tuning fork, an H-shaped tuning fork, a three-legged tuning fork, a comb teeth shape, an orthogonal shape, or a prism shape, as long as a cantilever structure having the fixing end portion and the free end portion is loaded. In addition, as the vibration element 30, other than the AT cut, the Z cut, and BT cut, a quartz crystal vibration element which uses the quartz crystal as a substrate material, for example, a quartz crystal vibration element of a SC cut may be employed, and a vibration element which uses other substrate materials, such as a surface acoustic wave (SAW) resonator piece or a micro electro mechanical systems (MEMS) vibration element, may be employed. In addition, as the substrate material of the vibration element 30, the SAW resonator piece, or the MEMS vibration element, other than the quartz crystal, a piezoelectric single crystal, such as lithium tantalite or lithium niobate, a piezoelectric material, such as piezoelectric ceramics (for example, lead zirconate titanate), or a silicon semiconductor material may be used. As excitation means, such as the vibration element 30, the SAW resonator piece, or the MEMS vibration element, means having a piezoelectric effect may be used, or an electrostatic driving by Coulomb force may be used.

Next, configuration materials of each component which configures the container 110 will be described.

The configuration material of the first substrate 20 which becomes the bottom plate 12, or the frame-like second substrate 122 and the third substrate 24 in which the center portion which becomes the side wall 114 is removed, which are for forming the container 110, is not particularly limited as long as the configuration material has insulation properties. For example, various types of ceramics including oxide-based ceramics (for example, alumina, silica, titanium, or zirconia), nitride based ceramics (for example, silicon nitride, aluminum nitride, or titanium nitride), or carbide-based ceramics (for example, silicon carbide); glass; or a resin, can be employed.

The configuration material of the external terminal 28 or the connection terminals 52 and 54 is not particularly limited, and for example, a metal material, such as gold (Au), gold alloy, platinum (Pt), aluminum (Al), aluminum alloy, silver (Ag), silver alloy, chrome (Cr), chrome alloy, nickel (Ni), copper (Cu), molybdenum (Mo), niobium (Nb), tungsten (W), iron (Fe), titanium (Ti), cobalt (Co), zinc (Zn), and zirconium (Zr), or an alloy combined by these material, can be employed.

The lid member 16 is a member made by processing glass, ceramics, and a metal flat plate, and mainly has a shape of a flat plate. In addition, the configuration material of the lid member 16 is not particularly limited, but it is preferable to use an inorganic material or a metal material having a linear expansion coefficient which is similar to that of the configuration material of the container 110. Therefore, for example, in a case where the container 110 is a ceramics substrate, as the configuration material of the lid member 16, it is preferable to use an alloy including a Fe—Ni—Co-based alloy, such as cobalt, or an alloy including a Fe—Ni alloy, such as 42 alloy.

The electrode film, such as the excitation electrode 40, the lead electrode 42, and the pad electrode 44, which are formed on the substrate 32 of the vibration element 30, is configured of two layers including a lower ground layer and an upper layer.

Examples of the configuration material of the lower ground layer include a material having adhesiveness to the substrate 32, and specifically include metal elements, such as chrome (Cr), nickel (Ni), titanium (Ti), tungsten (W), silver (Ag), or aluminum (Al); or a mixture or an ally of one or more types thereof.

Meanwhile, examples of the configuration material of the upper layer includes a material having particularly high electrical conductivity, and specifically include precious metal elements, such as gold (Au), platinum (Pt), and silver (Ag); or a mixture or an alloy of one or more types thereof.

Next, regarding a positional relationship with the vibration element 30 or the excitation electrode 40, a relationship of L1 >L2 >L3 is satisfied when an interval between the end portion of the first side surface 34*a* and the end portion of the second side surface 34*b* of the vibration element 30 in the Z-axis direction is L1 , an interval between the end portion opposite to the second projection portion 118*b* of the first projection portion 118*a* and the end portion opposite to the first projection portion 118*a* of the second projection portion 118*b* in the Z-axis direction is L2 , and an interval between the end portion on the first side surface 34*a* side and the end portion on the second side surface 34*b* side of the excitation electrode 40 formed on the first surface 32*a* of the vibration element 30 which is the electronic film in the Z-axis direction is L3 , in a plan view.

In the relationship of each dimension, by satisfying L1 >L2 , when the impact is applied to the vibration element 30, the first projection portion 118*a* and the second projection portion 118*b* can support the free end portion of the vibration element 30. Therefore, it is possible to reduce a possibility of damage of the vibration element 30 generated as the free end portion of the vibration element 30 is largely displaced due to the impact. In addition, by satisfying L2 >L3, when the impact is applied to the vibration element 30, the first projection portion 118*a* and the second projection portion 118*b* come into contact with the electrode film which configures the excitation electrode 40, and it is possible to reduce a possibility of damage of the excitation electrode 40. Therefore, it is possible to reduce a change in the reference frequency or deterioration of temporal change characteristics. In addition, since the vibration element 30, the excitation electrode 40, the first projection portion 118*a*, and the second projection portion 118*b* are disposed as described above, for example, even when the excitation electrode 40 extends in the direction of the fourth side surface 34*d* in order to reduce the equivalent series resistance of the vibration element 30, it is possible to reduce a possibility that the excitation electrode 40 comes into contact with the first projection portion 118*a* and the second projection portion 118*b*. Therefore, when the impact is applied to the vibration element 30, the first projection portion 118*a* and the second projection portion 118*b* come into contact the electrode film which configures the excitation electrode 40, it is possible to reduce a possibility of damage of the excitation electrode 40. Therefore, it is possible to reduce a change in the reference frequency or deterioration of temporal change characteristics.

Next, the position of the first projection portion 118*a* and the second projection portion 118*b* which are disposed in a range surrounded by the side wall 114 will be described in detail.

The first projection portion 118*a* is disposed toward the direction of the third side surface 34*c* of the vibration element 30 from a region in which the first side wall portion 36*a* and the third side wall portion 36*c* of the side wall 114 are connected to each other, and the second projection portion 118*b* is disposed toward the direction of the third side surface 34*c* of the vibration element 30 from the region in which the second side wall portion 36*b* and the third side wall portion 36*c* of the side wall 114 are connected to each other.

By disposing the portions in this manner, since the first projection portion 118*a* and the second projection portion 118*b* are disposed toward the direction of the third side surface 34*c* of the vibration element 30 from the third side wall portion 36*c* of the container 110, it is possible to elongate the part which overlaps the vibration element 30 along the direction of linking the free end portion and the fixing end portion of the vibration element 30. Therefore, when the impact is applied to the vibration element 30, it is possible to support the free end portion side of the vibration element 30 which is largely displaced in a longer range. Therefore, it is possible to reduce a possibility of damage of the vibration element 30 generated as the free end portion of the vibration element 30 is largely displaced due to the impact. In addition, since the first projection portion 118*a* is disposed in a region in which the first side wall portion 36*a* and the third side wall portion 36*c* of the side wall 114 are connected to each other, and the second projection portion 118*b* is disposed in a region in which the second side wall portion 36*b* and the third side wall portion 36*c* of the side wall 114 are connected to each other, in the connection portion between the first side wall portion 36*a* and the third side wall portion 36*c*, and the connection portion between the second side wall portion 36*b* and the third side wall portion 36*c*, in the side wall 114 of the container 110, the distance from the outer circumference of the container 110 becomes large, and thus, an effect that the strength of the container 110 increases.

Fifth Embodiment

An oscillator 101*a* which serves as the electronic device according to a fifth embodiment of the present invention will be described with reference to FIGS. 15 and 16.

Figure 15:
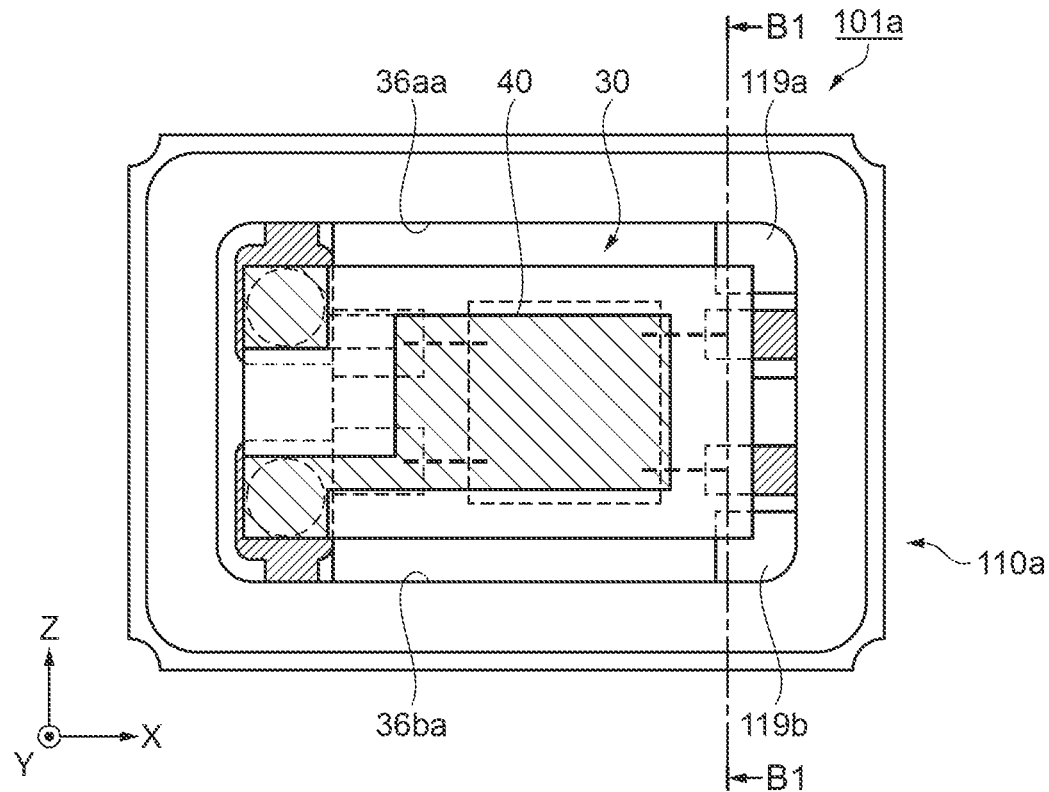
FIG. 15 is a schematic plan view illustrating a structure of an oscillator according to a fifth embodiment of the present invention.

FIG. 15 is a schematic plan view illustrating a structure of the oscillator according to the fifth embodiment of the present invention. FIG. 16 is a sectional view taken along line B1-B1 in FIG. 15.

The oscillator 101*a* according to the fifth embodiment is different from the oscillator 101 described in the fourth embodiment in the direction in which the upper surface of a first projection portion 119*a* and a second projection portion 119*b* is inclined, and the inclined surface in which the distance to the first surface 32*a* of the vibration element 30 monotonously elongates toward the side on which the first projection portion 119*a* and the second projection portion 119*b* are opposite to each other, is formed.

Since other configurations are substantially the same as those of the above-described oscillator 101 in the fourth embodiment, the oscillator 101*a* will be described while similar configuration elements are given the same reference numerals and numbers, and the description thereof is partially omitted.

Figure 16:
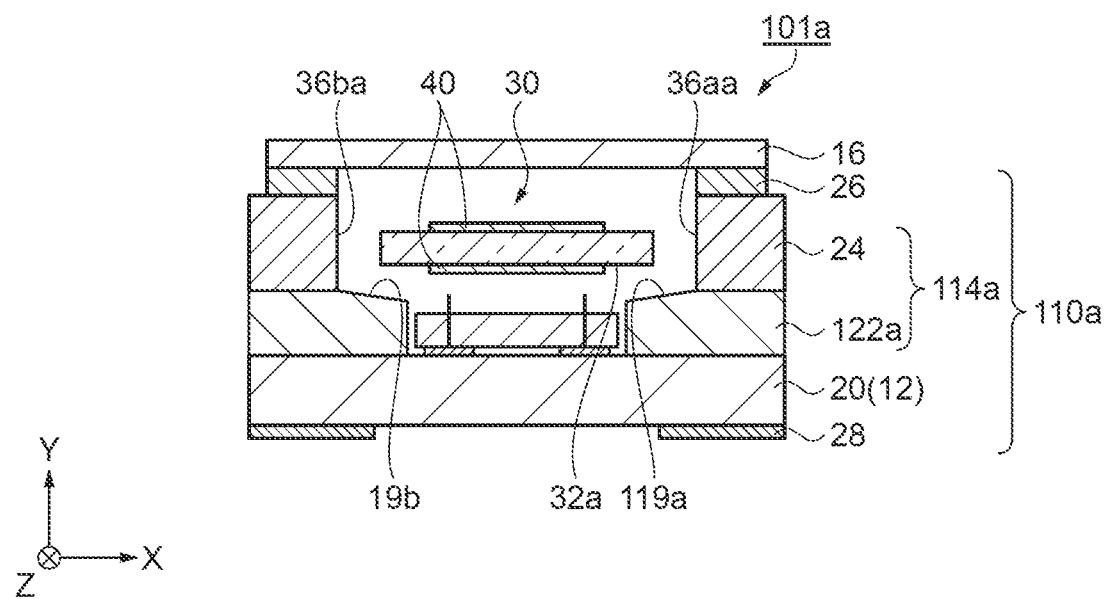
FIG. 16 is a sectional view taken along line B1-B1 in FIG. 15.

As illustrated in FIGS. 15 and 16, the oscillator 101*a* includes a container 110*a*, the lid member 16, the vibration element 30 accommodated in the cavity configured of the container 110*a* and the lid member 16, and the IC chip 60 which serves as the electronic component.

The container 110*a* is formed by stacking the first substrate 20 which becomes the bottom plate 12, a frame-like second substrate 122*a* in which the center portion which becomes a side wall 114*a* is removed, and the third substrate 24 provided with a first side wall portion 36*aa* and a second side wall portion 36*ba*.

In the container 110*a*, the first projection portion 119*a* and the second projection portion 119*b* which are integrated with the second substrate 122a is disposed on the upper surface of the first substrate 20 (bottom plate 12). In the first projection portion 119a, an inclined surface in which the upper surface of the first projection portion 119a is inclined from the first side wall portion 36aa of the side wall 114a toward the opposing second projection portion 119b side is inclined, and the distance to the first surface 32a of the vibration element 30 is monotonously elongates, is formed. In the second projection portion 119b, an inclined surface in which the upper surface of the second projection portion 119b is inclined from the second side wall portion 36ba side toward the opposing first projection portion 119a side is inclined, and the distance to the first surface 32a of the vibration element 30 is monotonously elongates, is formed.

In this configuration, in a case where the free end portion of the vibration element 30 is largely displaced due to the impact, since it is possible to support the side surface side of the free end portion of the vibration element 30 by the first projection portion 119a and the second projection portion 119b, it is possible to further reduce damage of the vibration element 30 due to the impact. In addition, since there is inclination, it is possible to reduce a possibility of damage of the excitation electrode 40, and to reduce a change in the reference frequency or deterioration of temporal change characteristics. Accordingly, it is possible to obtain the oscillator 101a having excellent impact resistance and stable oscillation characteristics.

Sixth Embodiment

An oscillator 101b which serves as the electronic device according to a sixth embodiment of the present invention will be described with reference to FIGS. 17 and 18.

Figure 17:
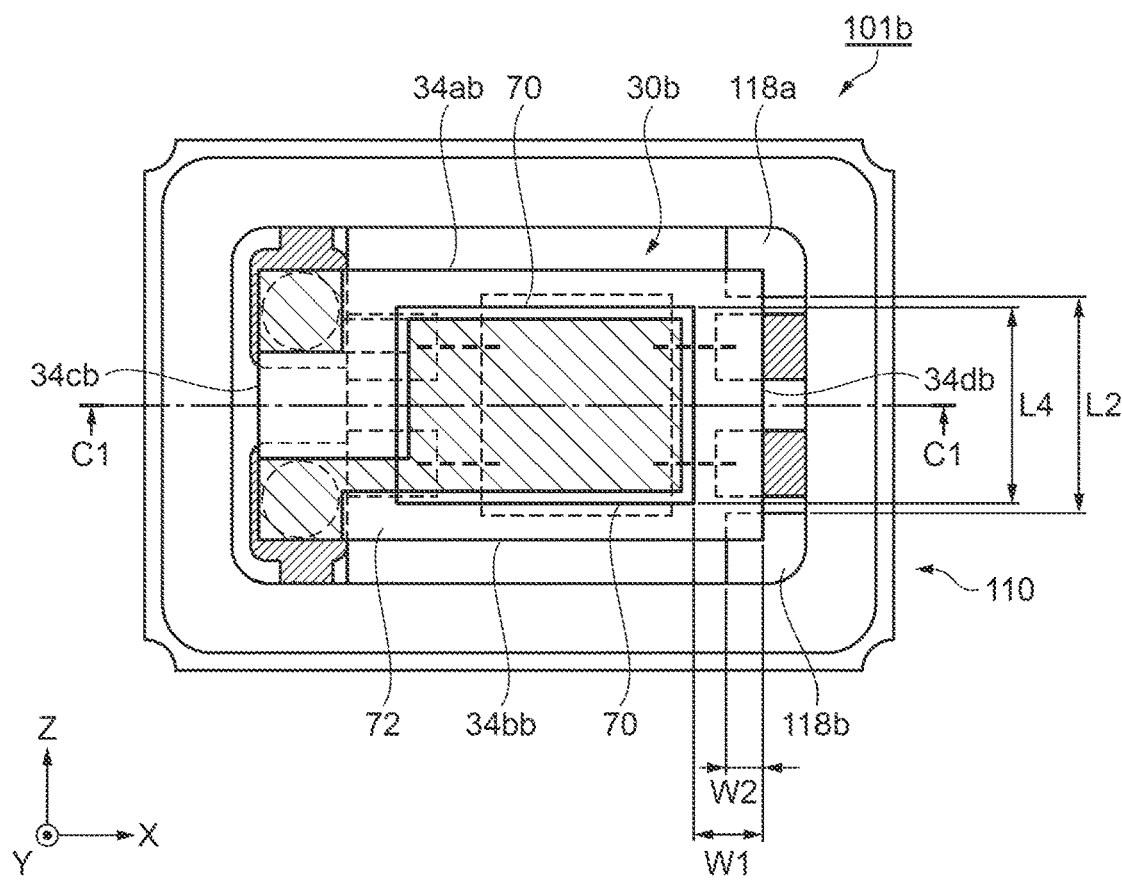
FIG. 17 is a schematic plan view illustrating a structure of an oscillator according to a sixth embodiment of the present invention.

FIG. 17 is a schematic plan view illustrating a structure of the oscillator according to the sixth embodiment of the present invention. FIG. 18 is a sectional view taken along line C1-C1 in FIG. 17.

The oscillator 101b according to the sixth embodiment is different from the oscillator 101 described in the fourth embodiment in the shape of the vibration element 30b which is placed in the container 110.

Since other configurations are substantially the same as those of the above-described oscillator 101 in the fourth embodiment, the oscillator 101b will be described while similar configuration elements are given the same reference numerals and numbers, and the description thereof is partially omitted.

Figure 18:
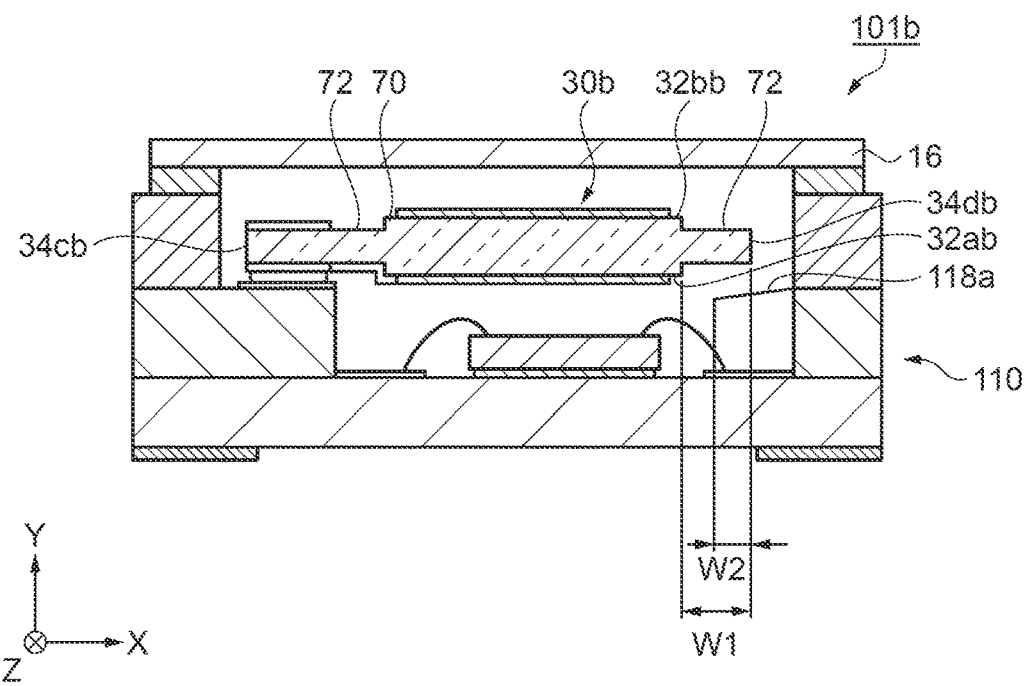
FIG. 18 is a sectional view taken along line C1-C1 in FIG. 17.

As illustrated in FIGS. 17 and 18, the oscillator 101b has a different shape of the vibration element 30b placed in the container 110. The vibration element 30b includes the first region 70 having a first thickness in the normal line direction of the first surface 32ab on the first surface 32ab and the second surface 32bb, and the second region 72 having a second thickness which is thinner than that of the first region 70 in the normal line direction of the first surface 32ab on the outer circumference of the first region 70. In other words, the shape of the vibration element 30b is a shape which has the first region 70 in which the plate thickness of the center portion is thick, and which is generally called a mesa type structure. Since the vibration element 30b of the mesa type structure can confine vibration energy in the first region 70, it is possible to reduce vibration leakage in which the vibration energy leaks to the container 110 via the fixing end portion of the vibration element 30b, and to have a high Q value.

The positional relationship between the vibration element 30b, and the first projection portion 118a and the second projection portion 118b satisfies a relationship of L2 >L4 and W1 >W2 when an interval between the end portion opposite to the second projection portion 118b of the first projection portion 118a and the end portion opposite to the first projection portion 118a of the second projection portion 118b in the Z-axis direction is L2, an interval between the end portion on the first side surface 34ab side and the end portion on the second side surface 34bb side of the first region 70 of the vibration element 30b in the Z-axis direction is L4, an interval between the end portion of the fourth side surface 34db of the vibration element 30b and the end portion on the fourth side surface 34db side of the first region 70 is W1, and a longer interval among an interval between the end portion of the fourth side surface 34db of the vibration element 30b and the end portion on a third side surface 34cb side of the first projection portion 118a of the container 110 in the X-axis direction, and an interval between the end portion of the fourth side surface 34db of the vibration element 30b and the end portion on the third side surface 34cb side of the second projection portion 118b of the container 110 in the X-axis direction is W2.

In the relationship of each dimension of the vibration element 30b of the mesa type structure having the first region 70, by satisfying the relationship of L2 >L4 and W1 >W2, it is possible to reduce a possibility of damage of the first region 70 of the vibration element 30b due to contact of the first projection portion 118a and the second projection portion 118b with the first region 70 of the vibration element 30b. Accordingly, it is possible to obtain the oscillator 101b which has excellent impact resistance and high Q value, and stably oscillates.

Next, modification examples of the electronic device according to the fourth to the sixth embodiments of the present invention will be described.

Modification Example 4

An oscillator 101c which serves as the electronic device according to a modification example 4 of the embodiments of the present invention will be described with reference to FIGS. 19 and 20.

Figure 19:
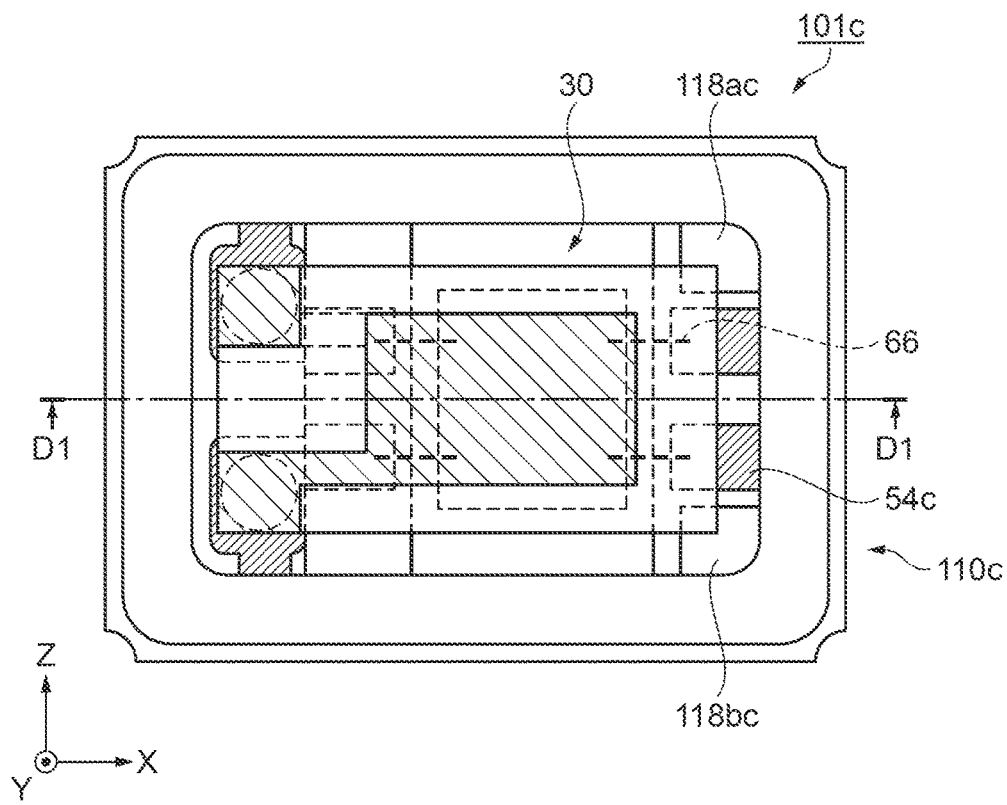
FIG. 19 is a schematic plan view illustrating a structure of an oscillator according to a modification example 4 of the embodiment of the present invention.

FIG. 19 is a schematic plan view illustrating a structure of the oscillator according to the modification example 4 of the embodiments of the present invention. FIG. 20 is a sectional view taken along line D1-D1 in FIG. 19.

The oscillator 101c according to the modification example 4 is different in a configuration of a container 110c, and in that the fourth substrate 21 is provided between the first substrate 20c and a second substrate 122c, compared to the oscillator 101 described in the fourth embodiment.

Since other configurations are substantially the same as those of the above-described oscillator 101 in the fourth embodiment, the oscillator 101c will be described while similar configuration elements are given the same reference numerals and numbers, and the description thereof is partially omitted.

Figure 20:
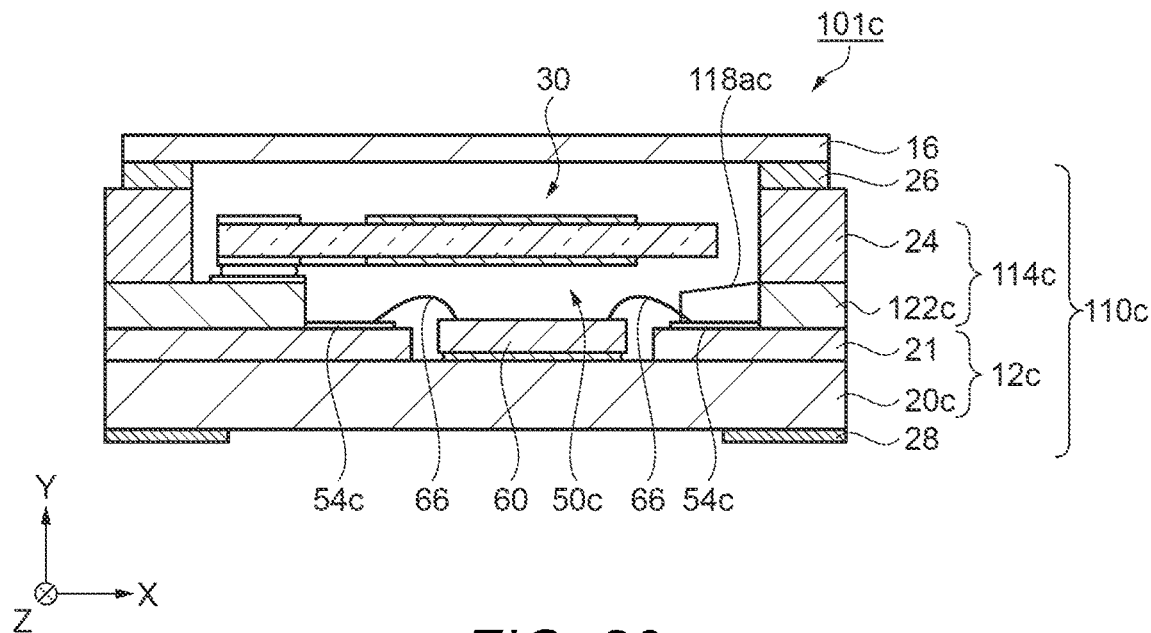
FIG. 20 is a sectional view taken along line D1-D1 in FIG. 19.

In the oscillator 101c, as illustrated in FIGS. 19 and 20, the bottom plate 12c of the container 110c is configured of two layers including the first substrate 20c and the frame-like fourth substrate 21 in which the center portion is removed, and the IC chip 60 is loaded in a region surrounded by the fourth substrate 21 on the upper surface of the first substrate 20c. A first projection portion 118ac and a second projection portion 118bc are integrated with the second substrate 122c, and are disposed on the upper surface of the fourth substrate 21. A side wall 114c is formed by disposing the third substrate 24 on the upper surface of the second substrate 122c, and the cavity 50c which accommodates the vibration element 30 is configured. The IC chip 60 is electrically connected to the connection terminal 54*c* formed on the upper surface of the fourth substrate 21 via the bonding wire 66.

In this configuration, since it is possible to widen the void between the IC chip 60 and the vibration element 30, it is possible to reduce the contact between the bonding wire 66 and the vibration element 30 which are connected to the IC chip 60, and to obtain the oscillator 101*c* having excellent impact resistance and high reliability.

Modification Example 5

An oscillator 101*d* which serves as the electronic device according to a modification example 5 of the embodiments of the present invention will be described with reference to FIGS. 21 and 22.

Figure 21:
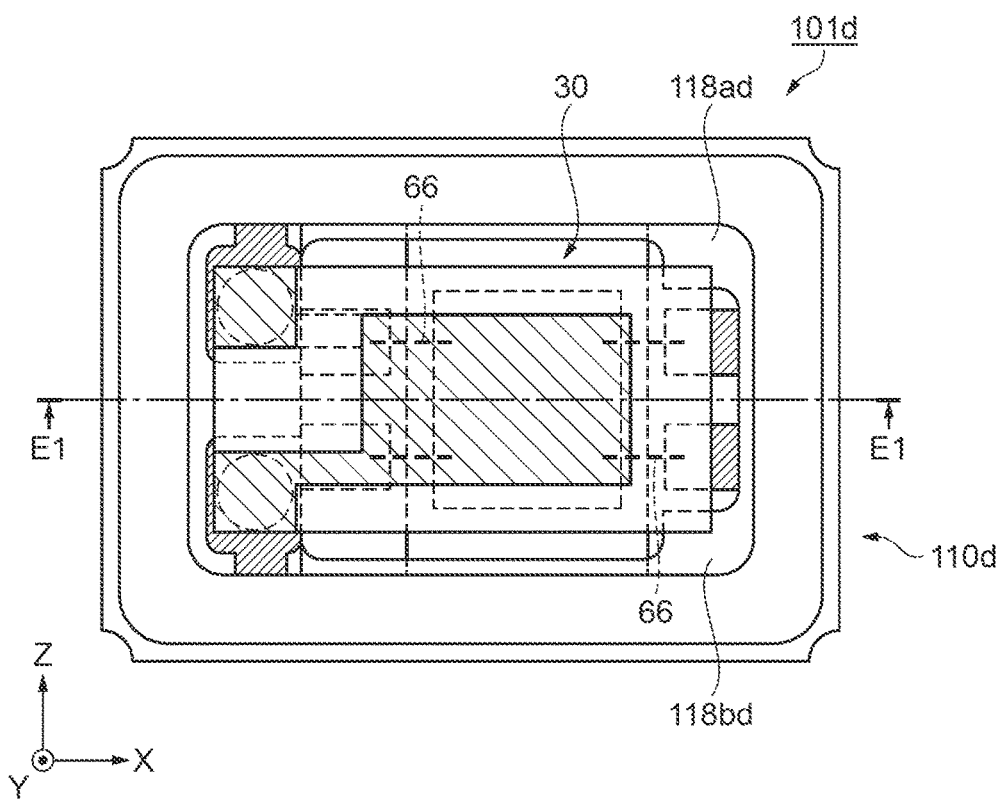
FIG. 21 is a schematic plan view illustrating a structure of an oscillator according to a modification example 5 of the embodiment of the present invention.

FIG. 21 is a schematic plan view illustrating a structure of the oscillator according to the modification example 5 of the embodiments of the present invention. FIG. 22 is a sectional view taken along line E1-E1 in FIG. 21.

The oscillator 101*d* according to the modification example 5 is different in a configuration of a container 110*d*, and in that the fourth substrate 21 is provided between the first substrate 20*c* and a second substrate 122*d* and there are many regions in which the second substrate 122*d* and the third substrate 24 which configure a side wall 114*d* do not overlap each other in a plan view, compared to the oscillator 101 described in the fourth embodiment.

Since other configurations are substantially the same as those of the above-described oscillator 101 in the fourth embodiment, the oscillator 101*d* will be described while similar configuration elements are given the same reference numerals and numbers, and the description thereof is partially omitted.

Figure 22:
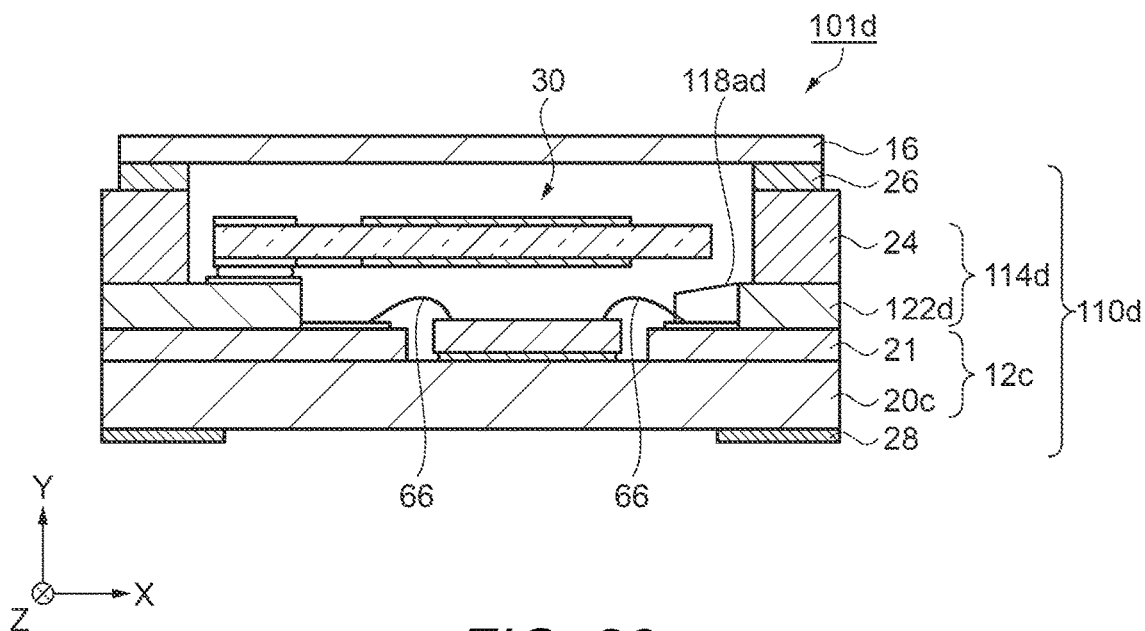
FIG. 22 is a sectional view taken along line E1-E1 in FIG. 21.

In the oscillator 101*d*, as illustrated in FIGS. 21 and 22, the bottom plate 12*c* of the container 110*d* is configured of two layers including the first substrate 20*c* and the frame-like fourth substrate 21 in which the center portion is removed, and a first projection portion 118*ad* and a second projection portion 118*bd* are integrated with the second substrate 122*d*, and are disposed on the upper surface of the fourth substrate 21. In the second substrate 122*d*, the width dimension (the length in the Z-axis direction) of the frame in the direction (Z-axis direction) intersecting the longitudinal direction (X-axis direction) of the vibration element 30, and the width dimension (the length in the Z-axis direction) on the side on which the first projection portion 118*ad* and the second projection portion 118*bd* are disposed, are longer than those of the third substrate 24. Therefore, there are many regions in which the second substrate 122*d* and the third substrate 24 do not overlap each other in a plan view.

In this configuration, since it is possible to thicken the width dimension of the frame of the side wall 114*d*, it is possible to improve the mechanical strength of the container 110*d*, and to obtain the oscillator 101*d* having excellent impact resistance and higher reliability.

Modification Example 6

A vibrator 2 which serves as the electronic device according to a modification example 6 of the embodiments of the present invention will be described with reference to FIGS. 23 and 24.

Figure 23:
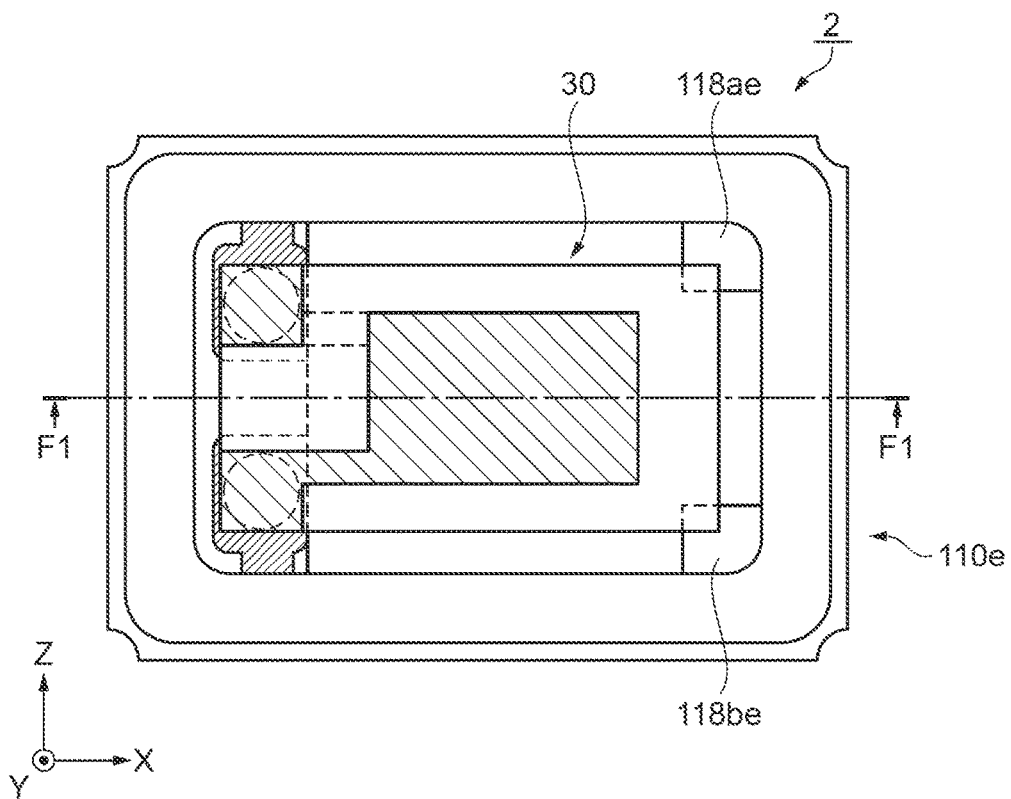
FIG. 23 is a schematic plan view illustrating a structure of a vibrator according to a modification example 6 of the embodiment of the present invention.

FIG. 23 is a schematic plan view illustrating a structure of the vibrator according to the modification example 6 of the embodiments of the present invention. FIG. 24 is a sectional view taken along line F1-F1 in FIG. 23.

The vibrator 2 according to the modification example 6 is different in a configuration of a container 110*e*, and in that the electronic component (IC chip) is not loaded, compared to the oscillator 101 described in the fourth embodiment.

Since other configurations are substantially the same as those of the above-described oscillator 101 in the fourth embodiment, the vibrator 2 will be described while similar configuration elements are given the same reference numerals and numbers, and the description thereof is partially omitted.

Figure 24:
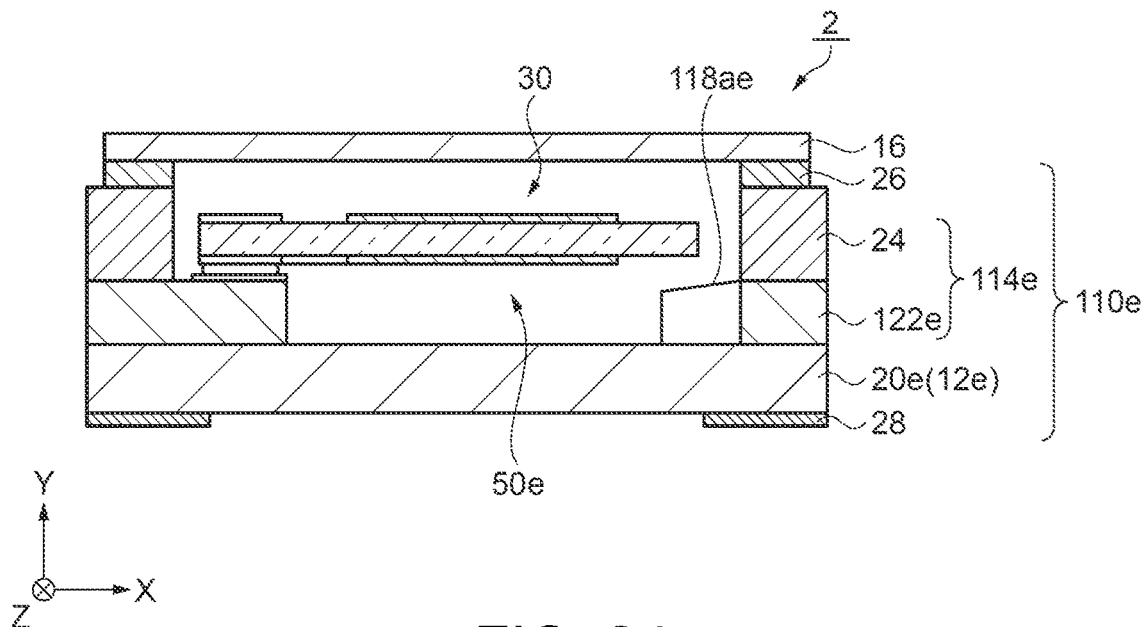
FIG. 24 is a sectional view taken along line F1-F1 in FIG. 23.

As illustrated in FIGS. 23 and 24, the vibrator 2 includes the container 110*e* and the vibration element 30 accommodated in the cavity 50*e* of the container 110*e*. In addition, the cavity 50*e* which accommodates the vibration element 30 is air-tightly sealed in an inert gas atmosphere, such as nitrogen or argon gas, or in a substantially vacuum pressure-reduced atmosphere. The container 110*e* is formed by stacking a first substrate 20*e* which becomes the bottom plate 12*e* and a frame-like second substrate 122*e* and the third substrate 24 in which the center portion which becomes a side wall 114*e* is removed. A first projection portion 118*ae* and a second projection portion 118*be* are integrally formed with the second substrate 122*e* which configures the side wall 114*e*, and are disposed on the upper surface of the first substrate 20*e* (bottom plate 12*e*). In addition, the cavity 50*e* which is the accommodation space which accommodates the vibration element 30 is configured of a region surrounded by the bottom plate 12*e* and the side wall 114*e*, and the lid member 16 bonded by the sealing member 26.

In this configuration, since it is possible to make the plate thickness (the length in the Y-axis direction) of the second substrate 122*e* thin, it is possible to obtain the vibrator 2 in which the container 110*e* is made thin, and which has excellent impact resistance and high reliability with the thin shape.

Electronic Apparatus

Next, an electronic apparatus (electronic apparatus of the present invention) provided with the electronic device of the present invention will be described in detail by using an example in which the oscillator 1 according to the first embodiment is provided, with reference to FIGS. 25 and 27.

Figure 25:
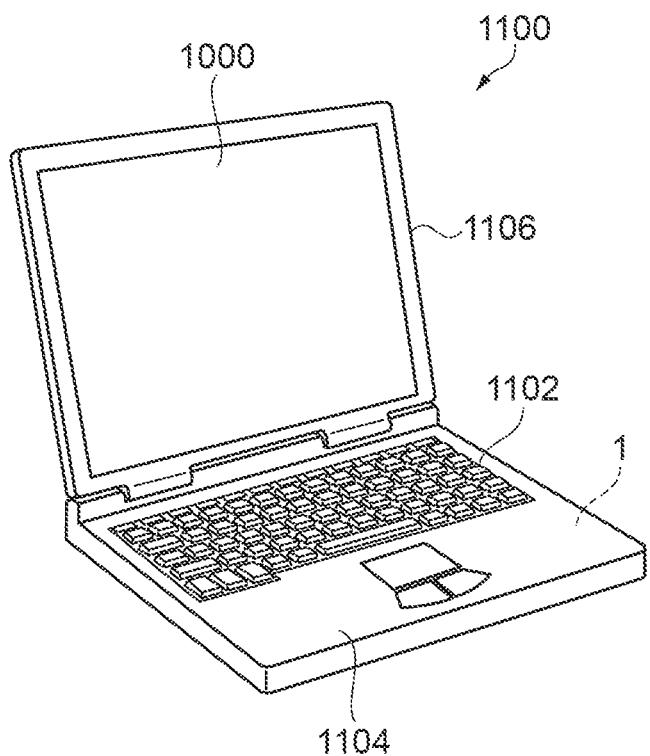
FIG. 25 is a perspective view illustrating a configuration of a mobile type (or note type) personal computer in which an electronic apparatus provided with an electronic device of the present invention is employed.

FIG. 25 is a perspective view illustrating a configuration of a mobile type (or note type) personal computer in which the electronic apparatus provided with the electronic device of the present invention is employed. In FIG. 25, a personal computer 1100 is configured of a main body portion 1104 provided with a keyboard 1102, and a display unit 1106 provided with a display portion 1000, and the display unit 1106 is supported to be rotatable via a hinge structure portion with respect to the main body portion 1104. The oscillator 1 which serves as the electronic device that functions as a reference clock or the like is embedded in the personal computer 1100.

Figure 26:
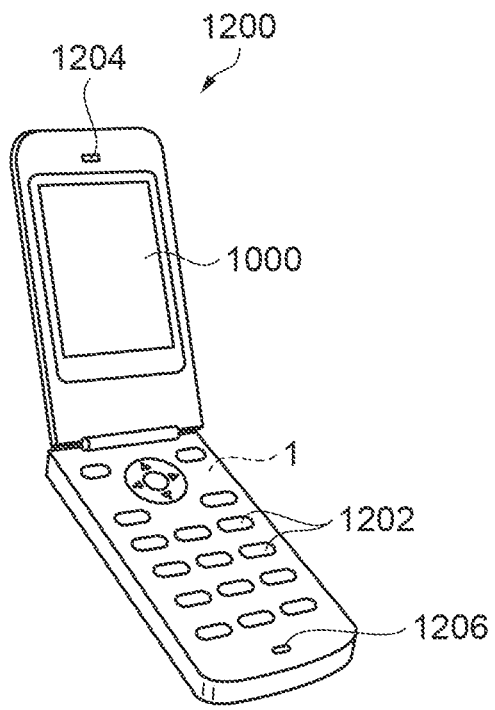
FIG. 26 is a perspective view illustrating a configuration of a portable phone (including PHS) in which the electronic apparatus provided with the electronic device of the present invention is employed.

FIG. 26 is a perspective view illustrating a configuration of a portable phone (including PHS) in which the electronic apparatus provided with the electronic device of the present invention is employed. In FIG. 26, a portable phone 1200 is provided with a plurality of operating buttons 1202, an earpiece 1204, and a mouthpiece 1206, and the display portion 1000 is disposed between the operating buttons 1202 and the earpiece 1204. The oscillator 1 which serves as the electronic device that functions as a reference signal source or the like is embedded in the portable phone 1200.

Figure 27:
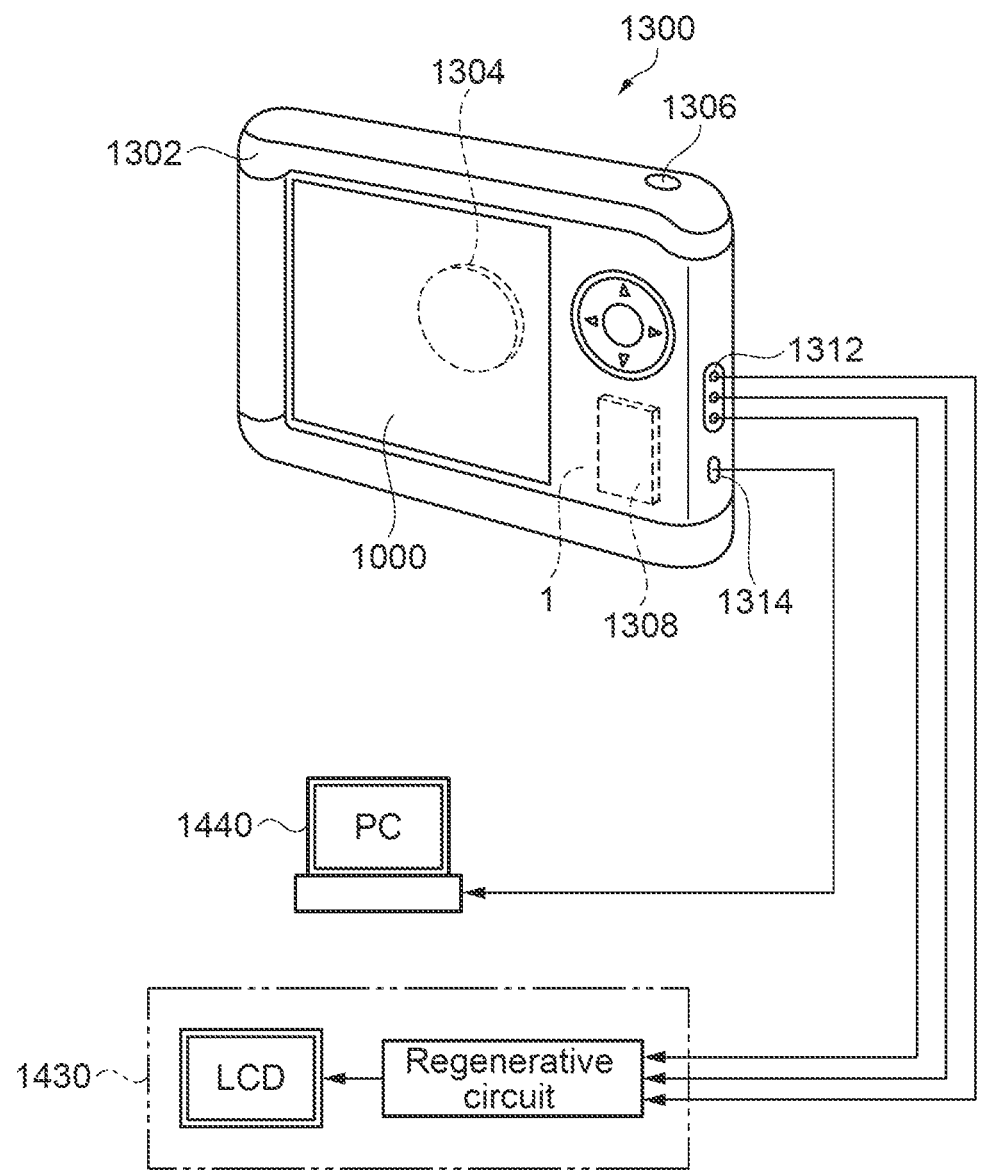
FIG. 27 is a perspective view illustrating a configuration of a digital camera in which the electronic apparatus provided with the electronic device of the present invention is employed.

FIG. 27 is a perspective view illustrating a configuration of a digital camera in which the electronic apparatus provided with the electronic device of the present invention. In addition, in FIG. 27, the connection with an external apparatus is also simply illustrated. Here, while a general camera exposes a silver salt photographic film to the light by an optical image of a subject, a digital camera 1300 photoelectrically converts the optical image of the subject by an imaging element, such as a charge coupled device (CCD), and generates a capturing signal (image signal).

On the rear surface of a case (body) 1302 in the digital camera 1300, the display portion 1000 is disposed, the display is performed based on the capturing signal by the CCD, and the display portion 1000 functions as a finder which displays the subject as an electronic image. In addition, on the front surface side (rear surface side in FIG. 27) of the case 1302, a light receiving unit 1304 including an optical lens (imaging optical system) or the CCD, is provided.

When the person who captures the image confirms the subject image displayed on the display portion 1000, and pushes a shutter button 1306, at this point of time, the capturing signal of the CCD is transferred to and stored in a memory 1308. In addition, in the digital camera 1300, a video signal output terminal 1312 and a data communication input/output terminal 1314 are provided on the side surface of the case 1302. In addition, as illustrated in FIG. 27, a television monitor 1430 is connected to the video signal output terminal 1312, and a personal computer 1440 is connected to the data communication input/output terminal 1314 as necessary. Furthermore, by a predetermined operation, the capturing signal stored in the memory 1308 is configured to be output to the television monitor 1430 or the personal computer 1440. The oscillator 1 which serves as the electronic device that functions as a time source or the like is embedded in the digital camera 1300.

In addition, as the electronic apparatus provided with the electronic device of the present invention, other than the personal computer (mobile type personal computer) 1100 of FIG. 25, the portable phone 1200 of FIG. 26, and the digital camera 1300 of FIG. 27, for example, an ink jet type discharge apparatus (for example, an ink jet printer), a laptop type personal computer, a tablet type personal computer, a storage area network apparatus, such as a router or a switch, a local area network apparatus, a vehicle terminal base station apparatus, a television, a video camera, a video recorder, a car navigation apparatus, a real time clock apparatus, a pager, an electronic notebook (including a communication function), an electronic dictionary, a calculator, an electronic game apparatus, a word processor, a workstation, a television phone, a television monitor for security, an electronic binoculars, a POS terminal, a medical apparatus (for example, an electronic thermometer, a hemadynamometer, a blood sugar meter, an electrocardiographic apparatus, an ultrasonic diagnostic apparatus, and an electronic endoscope), a fish detector, various types of measuring apparatuses, a measuring instrument (for example, measuring instrument of a vehicle, an airplane, or a vessel), a flight simulator, a head-mounted display, a motion trace, a motion tracking, a motion controller, or a pedestrian dead reckoning (PDR), can be employed.

Vehicle

Next, a vehicle provided with the electronic device of the present invention will be described.

Figure 28:
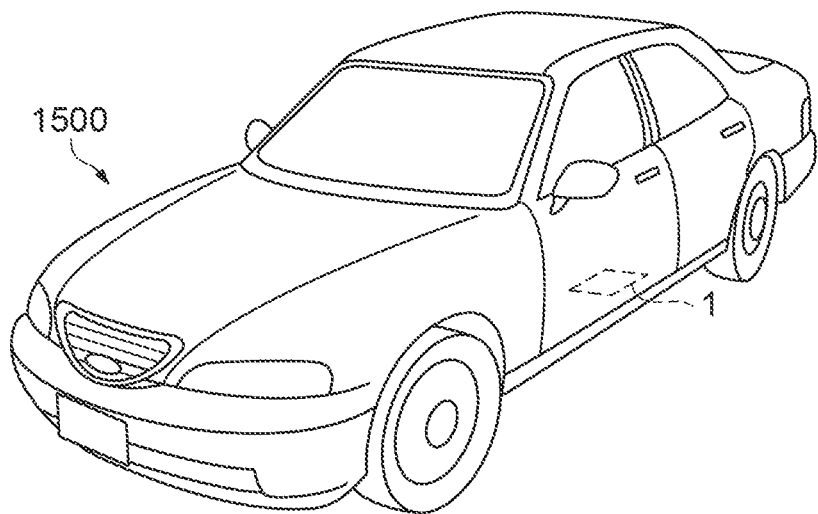
FIG. 28 is a perspective view schematically illustrating a motor vehicle as an example of a vehicle provided with the electronic device of the present invention is employed.

FIG. 28 is a perspective view schematically illustrating a motor vehicle which serves as an example of the vehicle of the present invention. The oscillator 1 which serves as the electronic device that functions as a reference clock or a reference signal source, is loaded in a vehicle 1500. The oscillator 1 can be widely employed in an electronic control unit (ECU), such as a keyless entry, an immobilizer, a car navigation system, a car air conditioner, antilock brake system (ABS), an airbag, a tire pressure monitoring system (TPMS), an engine controller, a brake system, a battery monitor of a hybrid vehicle or an electric vehicle, and a vehicle body posture control system.

Above, the present invention is described based on the appropriate embodiments, but the present invention is not limited thereto, and the configurations of each portion can be replaced with arbitrary configurations having similar functions.

In addition, in the present invention, arbitrary constituents may be added to the above-described embodiments, or each embodiment may be appropriately combined with each other.

In addition, the electronic device of the present invention may be any electronic device, other than the oscillators 1, 1a, 1b, 1c, 1d, 101, 101a, 101b, 101c, and 101d, or the vibrators 1e and 2, which are described in the above embodiments and modification examples. Specifically, a force sensor element (for example, an inertia sensor, such as an acceleration sensor and a gyro sensor, and an inclination sensor), a light emitting element, a light receiving element, a piezoelectric element, and an MEMS element, can be employed.

The entire disclosures of Japanese Patent Application Nos: 2014-81711, filed Apr. 11, 2014 and 2014-81712, filed Apr. 11, 2014 are expressly incorporated by reference herein.

The invention claimed is:

1. An electronic device comprising:
   a container including a bottom plate, and a first projection portion and a second projection portion which are disposed on the bottom plate;
   a vibration element which is accommodated in the container, the vibration element including:
      a first surface, a second surface, and a side surface which connects the first surface and the second surface to each other, the side surface including:
         a first side surface and a second side surface which are disposed to face oppositely away from each other, and a third side surface and a fourth side surface which are disposed to face oppositely away from each other and extend in a direction intersecting the first side surface and the second side surface;
   an electrode film on the first surface; and
   a connection member disposed between the first surface and the container at a proximal fixed end of the vibration element adjacent the third side surface so that the vibration element is cantilevered apart from the bottom plate with the first surface at a distal free end of the vibration element suspended over and facing only a part of an upper surface of the first projection portion and only a part of an upper surface of the second projection portion with a void therebetween,
   wherein the first projection portion and the second projection portion are disposed to be aligned with each other along an extending direction of the fourth side surface in a plan view, and
   wherein L1 is a width of the vibration element between the first side surface and the second side surface, L2 is an inside gap width between the first projection portion and the second projection portion, and L3 is a width of the electrode film between a first film edge extending in a direction along the first side surface and a second film edge extending in a direction along the second side surface; and
   L1>L2>L3.

2. The electronic device according to claim 1,
   wherein the container includes a first side wall portion disposed in the direction along the first side surface, a second side wall portion disposed in the direction along the second side surface, and a third side wall portion disposed in the direction along the fourth side surface, in a plan view,
wherein the first projection portion is projected in the direction of the third side surface from a region in which the first side wall portion and the third side wall portion come into contact with each other, and
wherein the second projection portion is projected in the direction of the third side surface from a region in which the second side wall portion and the third side wall portion come into contact with each other.

3. The electronic device according to claim 1, further comprising:
another projection portion disposed on the bottom plate,
wherein the another projection portion partially overlaps the fourth side surface, and does not overlap the electrode film, in a plan view.

4. The electronic device according to claim 1,
wherein the vibration element includes a first region having a first thickness along a vertical direction of the first surface, and a second region which is integrally provided at an outer circumference of the first region and has a second thickness which is thinner than that in the first region along the vertical direction,
L4 is a width of the first region between a first edge extending in the direction along the first side surface and a second edge extending in the direction along the second side surface, W1 is a width of the second region from an interface with the first region to the fourth side surface, and W2 is a longer one of:
an interval between the fourth side surface and an inboard edge of the first projection portion; and
an interval between the fourth side surface and an inboard edge of the second projection, and
L2>L4 and W1>W2.

5. The electronic device according to claim 3,
wherein the vibration element includes a first region having a first thickness along a vertical direction of the first surface, and a second region which is integrally provided at an outer circumference of the first region and has a second thickness which is thinner than that in the first region along the vertical direction,
L4 is a width of the first region between a first edge extending in the direction along the first side surface and a second edge extending in the direction along the second side surface, W1 is a width of the second region from an interface with the first region to the fourth side surface, and W2 is a longer one of:
an interval between the fourth side surface and an inboard edge of the first projection portion; and
an interval between the fourth side surface and an inboard edge of the second projection, and
L2>L4 and W1>W2.

6. The electronic device according to claim 1,
wherein an electronic component is disposed in the container.

7. The electronic device according to claim 3,
wherein an electronic component is disposed in the container.

8. The electronic device according to claim 4,
wherein an electronic component is disposed in the container.

9. An electronic device comprising:
a container including a bottom plate, and a loading portion and a projection portion which are disposed on the bottom plate;
a vibration element which is accommodated in the container, the vibration element including:
a first surface, a second surface, and a side surface which connects the first surface and the second surface to each other, the side surface including:
a first side surface and a second side surface which are disposed to face oppositely away from each other, and a third side surface and a fourth side surface which are disposed to face oppositely away from each other and extend in a direction intersecting the first side surface and the second side surface;
a connection member disposed between the first surface and the loading portion at a proximal fixed end of the vibration element adjacent the third side surface so that that the vibration element is cantilevered apart from the bottom plate with the first surface at a distal free end of the vibration element suspended over and facing only a part of an upper surface of the projection portion with a void therebetween, and
wherein a first virtual surface coplanar with a surface on which the connection member of the loading portion is disposed, and a second virtual surface coplanar with the upper surface of the projection portion which faces the vibration element, intersect each other by an angle which is greater than 90 degrees and smaller than 180 degrees.

10. An electronic apparatus comprising:
the electronic device according to claim 1.

11. A vehicle comprising:
the electronic device according to claim 1.

* * * * *